(12) United States Patent
Burt et al.

(10) Patent No.: US 9,766,593 B2
(45) Date of Patent: Sep. 19, 2017

(54) MERCURY TRAPPED ION FREQUENCY STANDARD FOR ULTRA-STABLE REFERENCE APPLICATIONS

(71) Applicant: CALIFORNIA INSTITUTE OF TECHNOLOGY, Pasadena, CA (US)

(72) Inventors: Eric A. Burt, La Canada Flintridge, CA (US); Robert L. Hamell, Pasadena, CA (US); Blake C. Tucker, Pasadena, CA (US); Kameron Larsen, La Canada Flintridge, CA (US); Robert L. Tjoelker, La Crescenta, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 14/626,814

(22) Filed: Feb. 19, 2015

(65) Prior Publication Data
US 2015/0249456 A1    Sep. 3, 2015

Related U.S. Application Data

(60) Provisional application No. 61/941,891, filed on Feb. 19, 2014.

(51) Int. Cl.
| | | |
|---|---|---|
| *H01S 1/06* | (2006.01) | |
| *G04F 5/14* | (2006.01) | |
| *H03L 7/26* | (2006.01) | |

(52) U.S. Cl.
CPC ............... *G04F 5/14* (2013.01); *H01S 1/06* (2013.01); *H03L 7/26* (2013.01); *Y10T 29/49016* (2015.01); *Y10T 29/49018* (2015.01)

(58) Field of Classification Search
CPC ....... H03L 7/26; G04F 5/14; Y10T 29/49016; Y10T 29/49018; H01S 1/06
(Continued)

(56) References Cited

U.S. PATENT DOCUMENTS

| | | |
|---|---|---|
| 5,420,549 A | 5/1995 | Prestage et al. |
| 8,026,768 B1 | 9/2011 | Burt et al. |
| 8,058,936 B2 | 11/2011 | Prestage et al. |

OTHER PUBLICATIONS

Tjoelker, R.L., et al., "Stability Measurements of a JPL Multi-Pole Mercury Trapped Ion Frequency Standard at the USNO", Proceedings of the 2003 Joint Meeting of the 17th EFTF and 58th Ann. Symp. on Frequency Control, Tampa, FL; May 5-8, 2003.
(Continued)

*Primary Examiner* — Richard Tan
(74) *Attorney, Agent, or Firm* — Gates & Cooper LLP

(57) ABSTRACT

An atomic clock including an ion trap assembly, a C-field coil positioned for generating a first magnetic field in the interrogation region of the ion trap assembly, a compensation coil positioned for generating a second magnetic field in the interrogation region, wherein the combination of the first and second magnetic fields produces an ion number-dependent second order Zeeman shift (Zeeman shift) in the resonance frequency that is opposite in sign to an ion number-dependent second order Doppler shift (Doppler shift) in the resonance frequency, the C-field coil has a radius selected using data indicating how changes in the radius affect an ion-number-dependent shift in the resonance frequency, such that a difference in magnitude between the Doppler shift and the Zeeman shift is controlled or reduced, and the resonance frequency, including the adjustment by the Zeeman shift, is used to obtain the frequency standard.

19 Claims, 15 Drawing Sheets

(58) Field of Classification Search
USPC .................................................... 331/94.1, 3
See application file for complete search history.

(56) References Cited

OTHER PUBLICATIONS

Burt, E.A., et al., "A Compensated Multi-pole Linear Ion Trap Mercury Frequency Standard for Ultra-Stable Timekeeping", IEEE Transactions on Ultrasonics, Ferroelectrics, and Frequency Control, Dec. 2008, pp. 2586-2595, vol. 55, No. 12.

Tjoelker, R.L., et al., "A Mercury Ion Frequency Standard Engineering Prototype for the NASA Deep Space Network", Proceedings of the 50th Annual IEEE IFCS, Honolulu, Hawaii Jun. 5-7, 1996, pp. 1073-1081.

Prestage, J.D., et al., "Higher Pole Linear Traps for Atomic Clock Applications", Proceedings of the 1999 Joint Meeting EFTF—IEEE IFCS.

Burt, E.A., et al., "Sub-10 -16 Frequency Stability in the JPL Multi-Pole Linear Ion Trap Standard", Proceedings of the 2006 PTTI, Reston, VA (2006), pp. 271-292.

Petit, G., "Atomic time scales TAI and TT (BIPM): present performances and prospects", Highlights of Astronomy, Aug. 2009, pp. 220-221, vol. 15.

Burt, E.A., et al., "Compensated Multi-Pole Mercury Trapped Ion Frequency Standard and Stability Evaluation of Systematic Effects", Proceedings of the 2008 IFCS, Hawaii (2008).

Fortier, T.M., et al., "Generation of ultrastable microwaves via optical frequency division", Nature Photonics, Jul. 2011, pp. 425-429, vol. 5.

Tjoelker, R.L., et al., "Mercury Atomic Frequency Standards for Space Based Navigation and Timekeeping", Proceedings of the 43rd annual PTTI (2011), pp. 293-304.

Chung, S.K., et al., "Buffer Gas Experiments in Mercury (Hg+) Ion Clock", Proceedings of the 2004 IEEE IFCS (2004), pp. 130-133.

Yi, L., et al., "Progress Towards a Dual-Isotope Trapped Mercury Ion Atomic Clock: Further Studies of Background Gas Collision Shifts", Proceedings of the 2012 IEEE IFCS (2012).

Shen, G.L., "The pumping of methane by an ionization assisted Zr/Al getter pump", J. Vac. Sci. Technol. A., Jul./Aug. 1987, pp. 2580-2583, vol. 5, No. 4.

Cacciapuoti, L., et al., "Atomic Clock Ensemble in Space", Journal of Physics: Conference Series, 2011, pp. 1-13, vol. 327, 021049.

Prestage, J.D., et al., "Ultra-stable Hg+ trapped ion frequency standard", Journal of Modern Optics, 1992, pp. 221-232, vol. 39, No. 2.

Allan, D., et al., "The Science of Timekeeping, Application Note 1289", downloaded from http://www.allanstime.com/Publications/DWA/Science_Timekeeping/TheScienceOfTimekeeping.pdf.

Burt, E.A., et al., "Characterization and Reduction of Number Dependent Sensitivity in Multi-pole Linear Ion Trap Standards", Proc. 2005 IEEE Int. Frequency Control Symp., Vancouver, Canada, pp. 466-471.

Prestage, J.D., et al., "Miniaturized Mercury Ion Clock for Ultra-Stable Deep Space Applications", Proceedings of the 38th PTTI (2006).

Prestage, J.D., "Next Generation Space Atomic Clock", Stanford 2011 PNT Challenges and Opportunities, Nov. 18.

Matsakis, D., et al., "The Long-Term Stability of the U.S. Naval Observatory's Masers", 36th Annual Precise Time and Time Interval (PTTI) Meeting, 2004, pp. 411-422.

Burt, Eric A., et al., "JPL Ultrastable Trapped Ion Atomic Frequency Standards", IEEE Transactionson on Ultrasonics, Ferroelectrics, and Frequency Control, vol. 63, No. 7, Jul. 2016.

Burt, E., et al., "Next generation JPL ultra-stable trapped ion atomic clocks", Proceedings of the 45th Annual Precise Time and Time Interval Systems and Applications Meeting, Bellevue, Washington, Dec. 2013, pp. 55-61.

MERCURY TRAPPED ION FREQUENCY STANDARD FOR ULTRA-STABLE REFERENCE APPLICATIONS

CROSS REFERENCE TO RELATED APPLICATIONS

This application claims the benefit under 35 U.S.C. Section 119(e) of U.S. Provisional Patent Application Ser. No. 61/941,891, filed on Feb. 19, 2014, by Eric A. Burt, Robert L. Hamell, Blake C. Tucker, Kameron Larsen, and Robert L. Tjoelker, entitled "MERCURY TRAPPED ION FREQUENCY STANDARD FOR ULTRA-STABLE REFERENCE APPLICATIONS," which application is incorporated by reference herein.

STATEMENT REGARDING FEDERALLY SPONSORED RESEARCH AND DEVELOPMENT

The invention described herein was made in the performance of work under a NASA contract, and is subject to the provisions of Public Law 96-517 (35 USC 202) in which the Contractor has elected to retain title.

BACKGROUND OF THE INVENTION

1. Field of the Invention

This invention relates to ion atomic clocks and frequency standards.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

For its atomic clock characterization activities, the Naval Research Laboratory (NRL) requires reference clocks with better stability than those being characterized. Traditionally this has been accomplished using hydrogen maser atomic clocks, but recently the stability of the clocks being characterized has approached, or even exceeded, that of the masers. Thus it is necessary to use a reference clock with better stability, particularly on long time scales, than a hydrogen maser. An analogous situation exists in the Jet Propulsion Laboratory's (JPL's) Frequency Standards Test Lab (FSTL). This facility is charged with characterizing hydrogen masers that will be used in the National Aeronautics and Space Administration (NASA) Deep Space Network and so a reference clock with better long-term stability than a maser is needed in the FSTL as well.

While there are notable exceptions, typical masers drift at the $5 \times 10^{-16}$ to $2 \times 10^{-15}$/day (d) level [1]. In 2002, the first operational multi-pole trapped ion clock (or Linear Ion Trap frequency Standard (LITS)-8 or LITS-8) was installed at the United States Naval Observatory (USNO) and demonstrated a drift rate of about $1 \times 10^{-16}$/d [2]. The multipole trap greatly reduces sensitivity to frequency shifts caused by variations in ion number, but the small observed drift rate of LITS-8 was later attributed to a residual number-dependent effect [3].

In 1996, JPL developed an implementable and continuously operating mercury ion ($Hg^+$) clock, based on a quadrupole ion trap, for operation in the Deep Space Network (DSN) (LITS 4-7)[4]. The standard could discipline several Local Oscillators and could operate with a practical Voltage Controlled Oscillator (VCO) as the Local Oscillator (LO).

In 1999, JPL introduced a specialized "multipole" trap design that greatly reduced systematic relativistic effects [5], and in 2002, JPL developed implementable and continuously operating multipole based mercury ion clocks LITS-8 and LITS-9 [2] (LITS-8 and 9 were still the size of a full rack).

In 2007-2008, JPL demonstrated exceptional long-term stability in a trapped ion clock that used a multi-pole ion trap, coupled with a second-order Zeeman compensation scheme added to LITS-9, that virtually eliminated relativistic frequency shifts due to variations in the number of ions trapped [6]. Over a 9-month period of continuous unattended operation, LITS-9 exhibited a drift of less than $3 \times 10^{-17}$/day relative to TT(BIPM07) [3, 7], the world ensemble of primary standards, making it significantly more stable than most hydrogen masers [1].

Based on the LITS-9 stability results and lessons learned from that unit, since 2010 we have been developing the next generation mercury trapped ion frequency standard (referred to as Linear Ion Trap frequency Standard-10 (LITS-10) or L10). The immediate goal of L10 is to provide an advanced reference clock capability at the NRL and the JPL frequency standard test laboratories.

SUMMARY OF THE INVENTION

A method for fabricating an apparatus used in an atomic clock to obtain a frequency standard, comprising providing an ion trap assembly for trapping a number of ions participating in a clock transition and wherein a resonance frequency of the clock transition can be interrogated in an interrogation region of the ion trap assembly using electromagnetic radiation; positioning a C-field coil for generating a first magnetic field in the interrogation region; positioning a compensation coil for generating a second magnetic field in the interrogation region, wherein: the combination of the first and second magnetic fields produces an ion number-dependent second order Zeeman shift (Zeeman shift) in the resonance frequency that is opposite in sign to an ion number-dependent second order Doppler shift (Doppler shift) in the resonance frequency; the C-field coil has a radius selected using data indicating how changes in the radius affect an ion-number-dependent shift in the resonance frequency, such that a difference in magnitude between the Doppler shift and the Zeeman shift is controlled, reduced, or canceled; and the resonance frequency, including the adjustment by the Zeeman shift, is used to obtain the frequency standard.

The radius can be increased to a value that takes into account an overall size constraint for the apparatus, current that can be passed through the compensation coil, and such that the combination of the magnetic fields has a field strength of more than 60 milliGauss (mG). For example, the apparatus can fit within a volume of 36 inches long by 18 inches wide by 18 inches high.

The method can comprise selecting the radius wherein a variation of the ion number by 36% would result in an ion number dependent second order shift of at most 1.1(2) milli Hertz.

The combination of the magnetic fields and the radius can be selected to maintain or increase the number of the ions participating in the clock transition and taking into account decoherence due to coupling of Zeeman levels and motional side bands.

The ion trap assembly can comprise a first trap connected to a second trap wherein the ions can be transferred between the first trap and the second trap.

The apparatus can be contained in a vacuum system with increased bake-out temperature. For example, the method can further comprise placing the apparatus in a vacuum chamber, the vacuum chamber comprising a first window for inputting ultraviolet electromagnetic radiation to electromagnetically pump the ions into a ground state of the clock transition in the first trap, a second window for inputting microwave radiation into the second trap to interrogate the resonance frequency, and a third window for outputting fluorescence generated by the ions after excitation in the first trap by the ultraviolet electromagnetic radiation and after the interrogation in the second trap; and baking out the vacuum chamber comprising the apparatus at a temperature of more than 200 degrees Celsius (° C.) or more than 400° C.

The method can comprise providing the vacuum chamber comprising a buffer gas and a getter that reduces pressure of unwanted background gases in the vacuum chamber, and allowing the vacuum chamber to equilibrate for a time until methane gas evolution in the sealed chamber is no more than $6 \times 10^{-16}$ Torr/second. Pressure in the vacuum chamber one day after sealing may be no more than $1 \times 10^{-11}$ Torr, and/or the ions' lifetime in the traps can include one day without replenishing the buffer gas.

The vacuum chamber housing can consist essentially of titanium.

The method can further comprise selecting the radius of the C-field coil such that a shift in the resonance frequency due to the pressure is greater than the Doppler shift.

Direct Current (DC) electronics with increased stability and a field programmable gate array (FPGA) controller can be implemented to drive and control the apparatus configured as an atomic clock. For example, the method can further comprise providing a first current source for biasing the C-field coil and a second current source for biasing the compensation coil, wherein the current sources have a temperature coefficient of at most 500 parts per billion.

The method can further comprise providing Direct Current (DC) powered electronics that provide trapping voltages to the ion traps for trapping the ions in the ion trap assembly, drive or provide power to the current sources, drive or provide power to an optical source used to optically pump the ions into a ground state of clock transition, drive or provide power to an electron emitter used to create the ions, and drive or provide power to a local oscillator used to provide the electromagnetic radiation interrogating the resonance frequency.

The method can further comprise providing a controller including a field programmable gate array (FPGA), wherein the FPGA controls the DC powered electronics and a frequency of the electromagnetic radiation interrogating the resonance frequency provided by the local oscillator.

Refractive optics can be used to couple light into and out of the apparatus. The method can comprise positioning a first refractive optic for inputting ultraviolet electromagnetic radiation to electromagnetically pump the ions into a ground state of the clock transition in the first trap. The method can comprise positioning a second refractive optic for collecting the fluorescence generated by the ions after excitation in the first trap by the ultraviolet electromagnetic radiation and after the interrogation of the resonance frequency in the second trap.

The first and second refractive optics can comprise first and second aspheric doublets, respectively.

The method can further comprise designing the first aspheric doublet to reduce unwanted scattering off of nearby surfaces and image the ultraviolet electromagnetic radiation, comprising diffuse mercury plasma discharge having a wavelength of 194 nm, onto an ion cloud comprising the ions in the first trap.

The C-field coil, the compensation coil, the assembly, and the refractive optics can be dimensioned such that the apparatus fits within a surface area of 36 inches long by 18 inches wide by 18 inches high.

The method can further comprise providing the apparatus coupled to a local oscillator, wherein the resonance frequency and the LO frequency have an Allan Deviation of at most $4.5 \times 10^{-13}/\tau^{1/2}$ and $\tau$ is $10^5$ seconds or less, and the ions are $^{199}Hg^+$ ions.

The apparatus and local oscillator can consume a power of less than 40 Watts.

BRIEF DESCRIPTION OF THE DRAWINGS

Referring now to the drawings in which like reference numbers represent corresponding parts throughout.

DETAILED DESCRIPTION OF THE INVENTION

Figure 1:
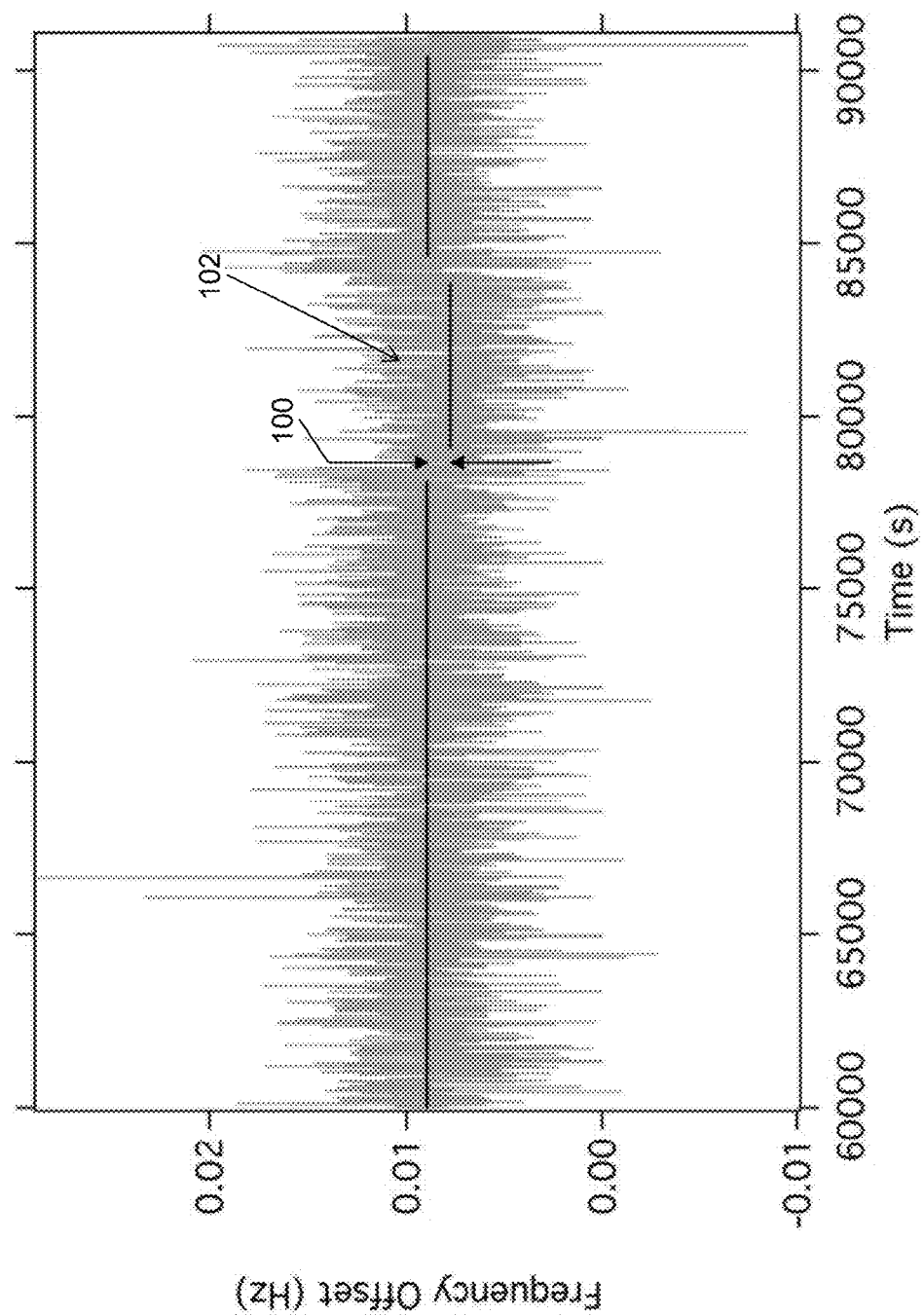
FIG. 1 plots frequency offsets (in Hertz (Hz)) between L10 and a maser according to one or more embodiments, wherein, for the middle segment, the ion number was reduced by 36%, resulting in a frequency change of −1.1(2) milliHertz (mHz).

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Much was learned from LITS-9 in achieving a high level of performance in a room temperature trapped ion clock. Table 1 shows the results of a stability evaluation of LITS-9 performed after the long run in 2007 [8].

TABLE 1

SUMMARY OF LITS9 INSTABILITIES.

| Effect | $\Delta f/f$ ($\times 10^{-17}$/day) | Uncertainty ($\times 10^{-17}$/day) |
|---|---|---|
| Second-order Doppler shift; ion temperature (neon pressure dependent) | −1.9 | 3.4 |
| Pressure shift: neon | −1.4 | 0.6 |
| Pressure shift: other background gas (assume: $CH_4$ worst case) | — | 0.94 |
| Second-order Doppler shift: ion number | −0.84 | 0.23 |
| Second-order Zeeman shift: filament voltage | −0.35 | 0.14 |
| Pressure Shift: neutral Hg | −0.22 | 0.40 |
| Second-order Zeeman shift: external field | — | 0.14 |
| Second-order Zeeman Shift: current source aging | −0.21 | 0.13 |
| AC Zeeman shift: trap potential aging | <0.00001 | <0.00001 |
| AC Stark Shift: Black Body | −0.0001 | 0.00004 |
| AC Stark Shift: Light Shift | +0.0001 | 0.0001 |
| AC Stark Shift: Trapping Fields | <−0.00002 | 0.00002 |
| Electronics Temperature Sensitivity | +0.11 | +0.01 −0.09 |

Table 1 shows the second-order Doppler shift due to variations in trapped ion number, previously the dominant systematic in this type of clock, was reduced to $4^{th}$ on the list by the second-order Zeeman compensation. The largest remaining systematic frequency perturbations were now due to variations in background gas pressure. To the extent these can be improved, LITS-9 stability performance can be improved even further.

To this end, changes were made to the L10 vacuum design, including the capability for a much higher vacuum bakeout temperature and the flexibility to optimize performance with several different vacuum pump approaches. The compensation scheme used in LITS-9 was experimental, so a goal for L10 was to engineer the compensation scheme into the design. The magnetic design for LITS-9 was a significant improvement over its predecessor units, offering improved shielding and better uniformity, however even further improvements are possible, particularly in conjunction with the inclusion of compensation into the design.

Short-term stability in these clocks is dependent on the choice of the LO. Improvements in the signal-to-noise ratio (SNR) make it possible to consider new emerging LO technologies such as optical-to-microwave conversion [9].

Thus, further L10 design variations according to one or more embodiments include improvements in the input and output optical efficiencies, which determine the SNR. Finally, design according to one or more embodiments can also include replacing commercial electronics with custom DC-powered versions for lower power [10] and/or building the whole unit into a smaller, modular package with a path towards easier portability and industrialization.

L10 Design

Built-in Compensation

Using the ion-number-dependent second order Zeeman shift to compensate the ion number-dependent second order Doppler shift is accomplished by introducing a small magnetic inhomogeneity in the multi-pole trap region of the clock. In LITS-9, the magnetic inhomogeneity was introduced with a coil at one end of the C-field solenoid. Modeling showed that the primary effect was due to radial field inhomogeneity [6]. All solenoids have this and it can be made arbitrarily small by increasing the solenoid radius or decreasing the solenoid current.

In the case of LITS-9, the solenoid radius was small and the effect of changing ion number due to the magnetic field had the opposite sign (positive with increasing ion number) but a larger magnitude than that of the second order Doppler effect. Thus, the net ion-number-dependent shift was positive with increasing ion number.

In the design of L10, we wanted to "tune" the solenoid radius so that the magnetic effect was equal in magnitude but opposite in sign to that of the relativistic effect. However, the minimum field that this type of clock can reliably operate at, to avoid decoherence due to coupling between Zeeman lines and motional side bands, is about 60 milliGauss (mG). To operate at this field magnitude while compensating the number-dependent second order Doppler shift would require an unacceptably large solenoid radius. Instead, we make the L10 solenoid radius as large as possible within limits set by overall size constraints such that the demand on the additional compensation coil is minimized.

FIG. 1 shows the change 100 in frequency caused by varying the ion number by 36% with compensation off, wherein, for the middle segment 102, the ion number was reduced by 36% resulting in a frequency change 100 of −1.1(2) mHz. The result of 1.1(2) mHz is a factor of two times (2×) smaller than that for the same number change in LITS-9 (because the L10 solenoid has a larger radius), thereby realizing this design goal.

Sealed Vacuum—Reduce Residual Largest Shifts: Pressure Stability

As noted above, since the relativistic ion-number-dependent shift no longer dominates in a compensated multi-pole standard, the next largest effects are pressure-related. Variations in background pressure have two broad sources: 1) variations in the neon buffer gas intentionally introduced for ion cooling purposes, and 2) outgassing (the evolution of gases from vacuum chamber walls).

In LITS-9, the vacuum chamber was operated with a turbo pump. However, neon is readily pumped by the turbo and so a neon source is required. LITS-9 used a capillary leak, but even slow capillary leaks evolve as the source empties, leading to a small non-zero variation in clock frequency due to the neon/Hg$^+$ collision shift. In a sealed vacuum system with a pump that has zero pumping speed for neon, a fixed amount of neon could be loaded, thereby eliminating fluctuations.

Due to limitations of certain vacuum components used in LITS-9, the LITS-9 vacuum bakeout temperature was limited to 200° C. A higher bakeout temperature would enable an exponentially lower outgassing rate and so lower frequency variations due to collision shifts with these gases, notably methane and hydrogen.

A fixed neon background is achieved in L10, as it has been in several ion clocks at JPL [11, 10], by using a sealed vacuum system with a getter pump. Getters only pump active gases and so do not pump neon, making them almost ideal for this application. One concern of the getter-pumped approach is other non-active gases not pumped by the getter, most notably methane. Other noble gases besides neon are not pumped, but have relatively small pressure shifts in Hg$^+$ and have no other deleterious effects. By contrast, methane is essentially non-reactive and has one of the largest known collision shift coefficients in Hg$^+$ [12]. Even a small change in methane concentration could significantly limit overall clock performance.

Initial experiments on a test system showed that methane increase in a high temperature baked getter-pumped system reaches acceptable levels after 1-2 months of equilibration time [8]. However the results of this measurement use a Residual Gas Analyzer (RGA) to continually monitor methane pressure and it is known that the hot filament of the RGA (as well as an ion gauge) can crack methane into hydrogen and carbon, which are readily pumped by the getter [14].

As a further test, LITS-9 was converted to use only a getter. While it was still only bakeable to 200° C., operation of LITS-9 with a getter could be used to place an upper bound on methane evolution and its impact on clock performance. Over a 1-year period of operation with a getter, LITS-9 demonstrated a drift rate of ~3×10$^{-17}$/day, similar to its previous turbo-pumped performance, though the operation was not continuous. This puts an upper bound on methane evolution of also about 1×10$^{-16}$ torr/s. It is important to note that this system also had an ion gauge present, which provided a hot filament to crack possibly evolving methane.

While the getter approach was promising, at this stage it was still not conclusive whether it would be useful in an ultra-stable clock application unless a hot filament was present. It is worth noting that even without a RGA or ion gauge, the trapped ion clocks have a hot electron emitter for generating an electron beam to load ions. This emitter, operated at a certain level, may be sufficient to crack methane.

Newer vacuum components, particularly optical window assemblies, are now rated to 450° C. With these installed on the L10 vacuum system, the L10 vacuum system bakeout temperature has been improved to greater than 400° C. In addition, the bulk of the vacuum chamber is fabricated from titanium, which is known to have superior outgassing characteristics in Ultra High Vacuum (UHV) chambers.

The resultant lower background gas evolution was observed in L10 in several ways. First, an integrated accumulation of several gases was monitored over a period of several months by closing a valve separating the main clock vacuum tube from an RGA. Upon opening the valve, the pressure transient was observed (accounting for variations due simply to the valve itself). The transient placed a limit on methane gas evolution in the L10 vacuum chamber of about 6×10$^{-16}$ torr/s, or several orders of magnitude lower than that of the LITS-9 vacuum chamber.

The lifetime of Hg$^+$ ions in the trap is largely governed by charge exchange with background gas molecules. Thus, the trap lifetime is usually proportional to background gas pressure. With the new vacuum system, the L10 trap lifetime is now measured in days compared to tens of minutes for the older systems. Extrapolating from the known LITS-9 base pressure of about 5×10$^{-10}$ torr, this indicates that the L10 pressure is less than 1×10$^{-11}$ torr.

Magnetic Enhancements

In addition to the magnetic design changes made in support of compensation, the C-field current source performance was enhanced. The evaluation in Table 1 shows that magnetic sensitivity is one of the leading systematic effects in the clock. By updating components, the L10 current source has a temperature coefficient of 500 parts per billion (ppb), about an order of magnitude less sensitive to temperature variations than its predecessor in LITS-9. Current source aging has also been reduced.

Refractive Optics—Smaller and More Efficient

LITS-9 used a reflective optics system with F/2 efficiency, where F is the F number or f/D, where f the system's focal length and D is the diameter of the entrance pupil or system aperture diameter. It is possible to greatly reduce size and improve efficiency using refractive optics. The L10 design uses a custom asphere doublet for both input and output optics. The doublet is designed to minimize the point spread function so as to limit scattering off of nearby surfaces, while imaging the diffuse mercury plasma discharge optical source (output wavelength 194 nm) onto the ion cloud, and has a collection efficiency of F/1.2.

Low Power DC Electronics and Dedicated FPGA-Based Controller

Figure 2:
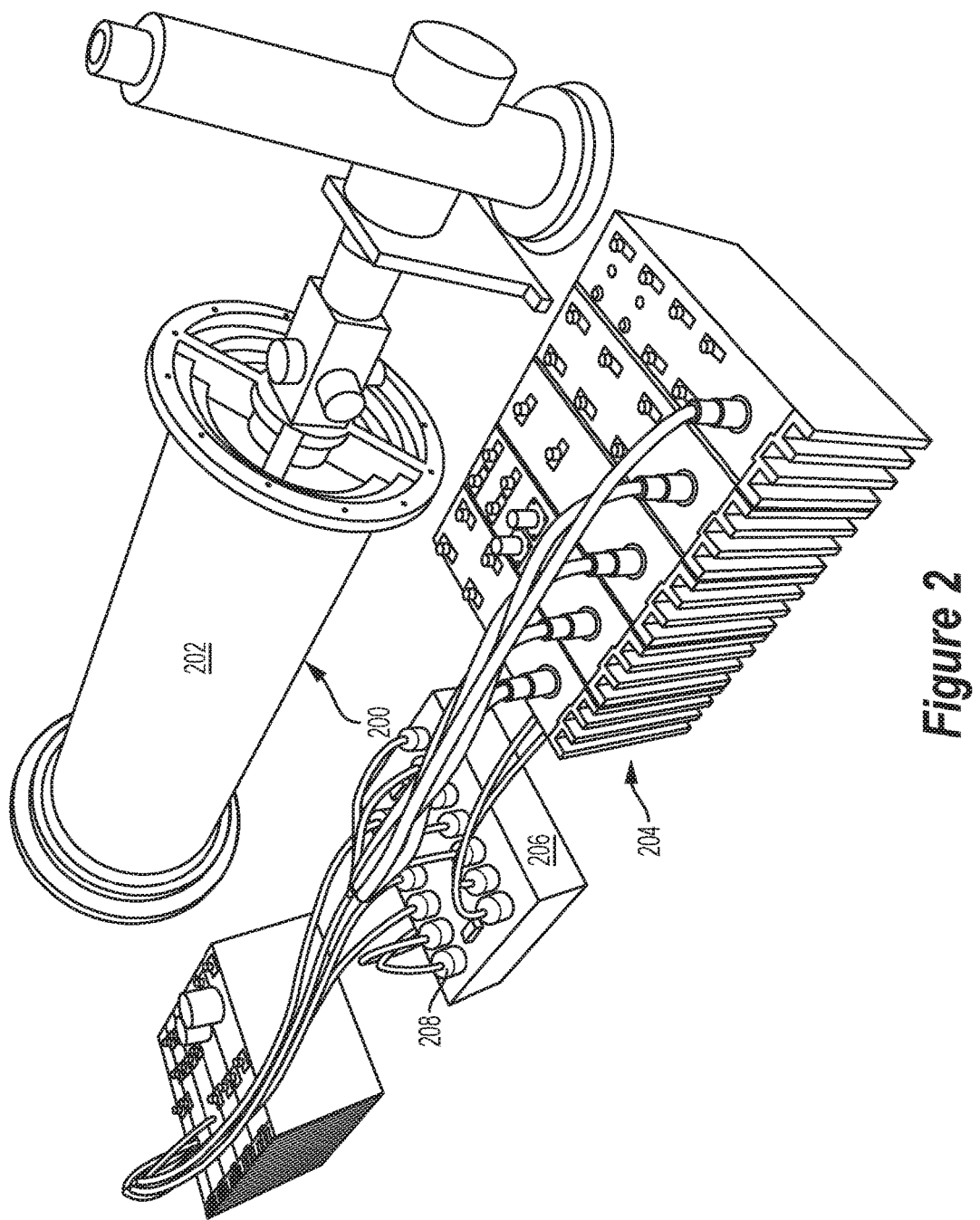
FIG. 2 is a photograph of L10 configured with Direct Current (DC)-powered electronics, wherein the physics package in the background has one magnetic shield layer installed, according to one or more embodiments.
Figure 3:
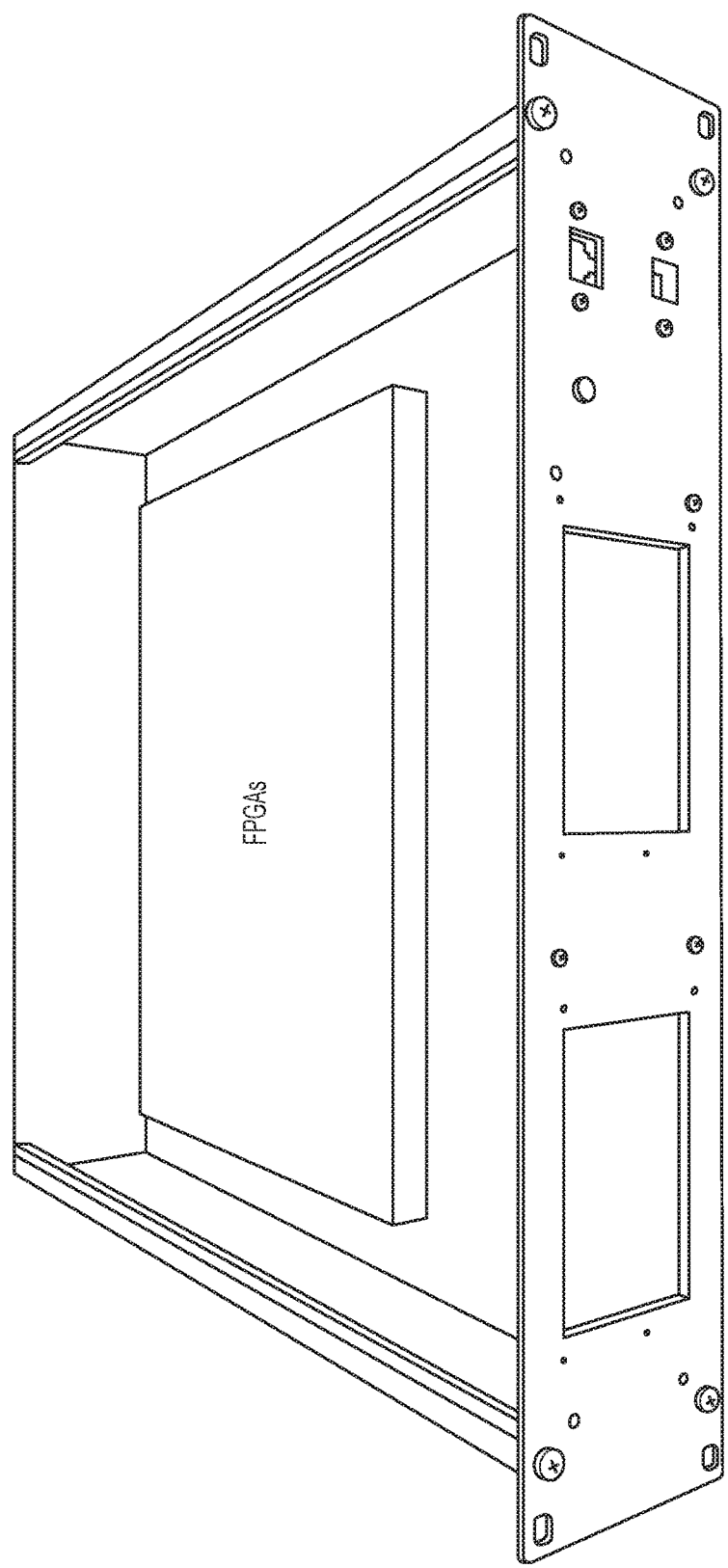
FIG. 3 is a photograph of a field programmable gate array (FPGA)-based L10 controller used for controlling the L10 according to one or more embodiments.

To improve reliability, reduce power consumption, and to reduce size, most commercial electronics used in LITS-9 were replaced by DC powered electronics. In addition, the obsolete VXI controller was replaced by a LINUX-based system running on an FPGA platform. FIG. 2 shows L10 200 with one magnetic shield layer 202 installed and configured with its DC-powered electronics 204 modules in place. Power conditioning 206 and power interface 208 is also shown in FIG. 2. FIG. 3 shows the FPGA-based controller for L10.

L10 Apparatus with Reduced Size

Figure 4:
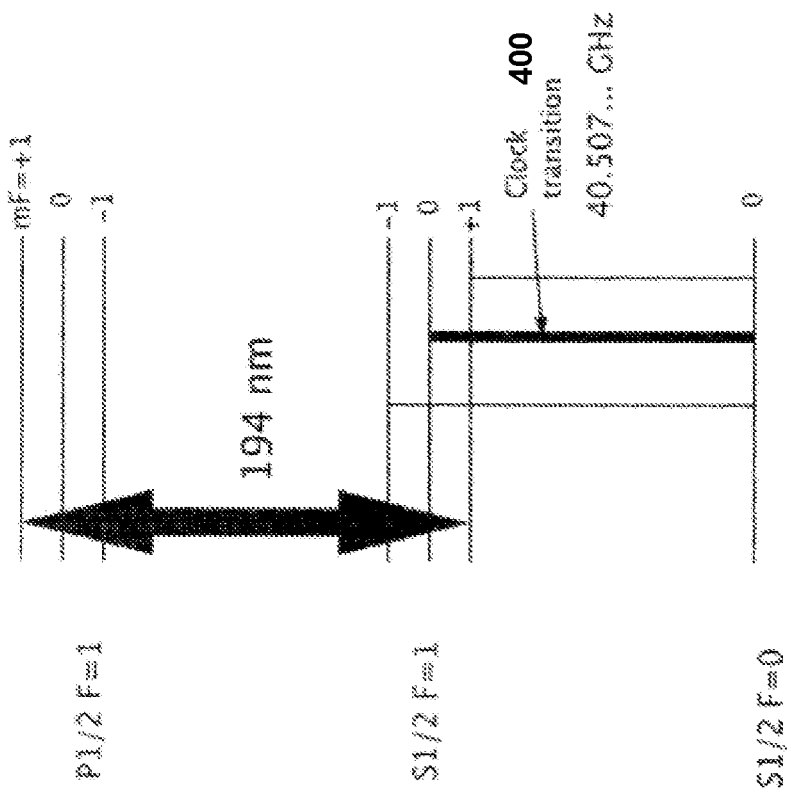
FIG. 4 is a simplified energy level diagram for $^{199}Hg^+$, taken from [16], that can be used as the clock transition in L10.

The multi-pole L10 atomic clock is based on the 40.5 GHz 6 s $2S_{1/2}$ F=0, mF=0-F=1, mF=0 hyperfine clock transition 400 in $^{199}$Hg$^+$ (illustrated in FIG. 4).

Figure 5A:
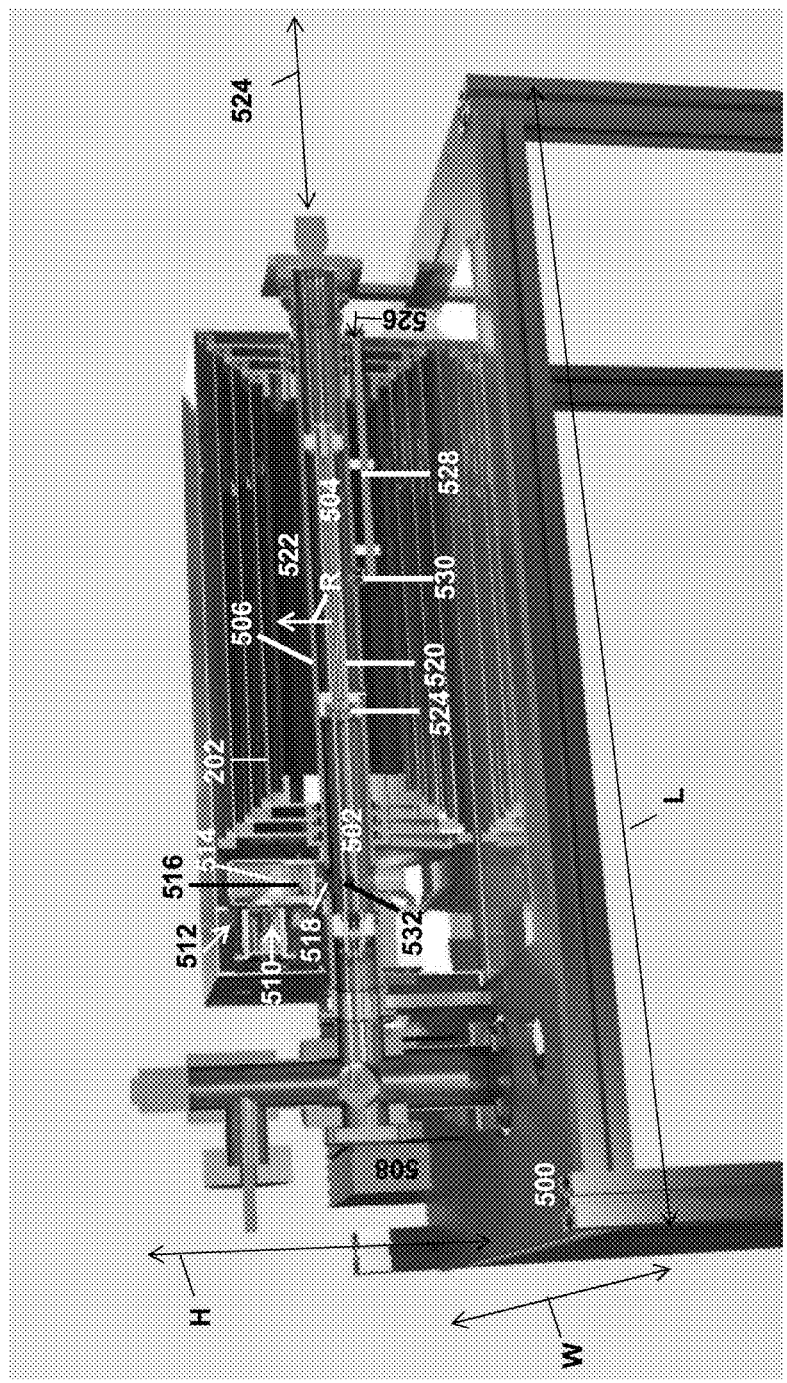
FIG. 5A is a computer aided design (CAD) cutaway view of the L10 physics package according to one or more embodiments, wherein the nested gray cylinders are magnetic shielding surrounding the solenoid shown in red, the vacuum chamber is shown blue, and the multi-pole trap region is shown in yellow.

An embodiment of L10 is illustrated in FIGS. 5A-5D. With an eye towards possible industrialization and further hardening, the overall size of the L10 system has been significantly reduced as compared to LITS-9. FIG. 5A shows a CAD cutaway of the L10 physics package. For scale, the stand 500 that it is mounted on is about 36 inches long by 18 inches wide. There is still a large amount of potential for further reduction in size, and the key component dimensions are already consistent with the dimension of a standard rack mount chassis.

The LITS comprises a conventional quadrupole RF linear ion trap 502 (referred to as the load trap (LT) where ion loading, state selection, and state detection take place), and a multi-pole RF linear ion trap 504 (referred to as the resonant trap (RT) where the sensitive microwave interrogation takes place).

$^{199}$Hg$^+$ ions (e.g., approximately 10$^7$ $^{199}$Hg$^+$ ions) are loaded into the quadrupole trap 502 using electron bombardment (using an electron emitter) of background neutral Hg. The traps 502, 504 are housed within an ultra-high vacuum (UHV) titanium vacuum chamber 506 with a getter pump 508. An ambient neon buffer gas inside the vacuum chamber 506 with a partial pressure (of e.g., about 4×10$^{-4}$ Pa) is used to cool the ions to near room temperature. Once loaded, the ions are then prepared in the F=0, mF=0 ground hyperfine state using a plasma discharge lamp (e.g., suprasil lamp) 510 which can be placed within a 2-loop resonator that excites the discharge at about 170 MHz. Light from the lamp resonator assembly 512 or lamp 510 may be reflected 514 and is focused by an asphere doublet 516 through a vacuum chamber input window 518 (e.g., suprasil vacuum window) to the trapped ions. The discharge lamp 510 uses $^{202}$Hg, which emits 194 nanometer (nm) wavelength light that has significant overlap with the F=1 hyperfine level of $^{199}$Hg$^+$, but not the F=0 level, thereby optically pumping the ions into the F=0 state. After loading and state selection, ions are "shuttled" into the multi-pole trap 504 by varying the relative trap DC biases (see, e.g., [17]). The multipole trap 504 has 12 parallel rods 520 evenly spaced on a circle 534, the rods having a radius of 6 millimeters (mm). A 1 Megahertz (MHz) trapping voltage is applied to each rod 520 with adjacent rods being 180° out of phase with each other.

Surrounding the multi-pole trap 504 is a coaxial solenoid 522 that provides a C-field (e.g., of 114 mG) along the longitudinal coaxial axis 524 of the traps, defining a quantization axis along the longitudinal axis 524 such that decoherence due to coupling between Zeeman lines and motional side bands is avoided. The current source driving the C-field solenoid can have better than 500 ppb temporal stability. Surrounding the interface or transition region 536 between the traps 502, 504 is a coaxial compensating coil 524 (coaxial with the traps 504, 502) and that compensates the ion number-dependent second order Doppler shift produced by the C-field solenoid 522. Microwaves 526 to drive the clock transition 400 are delivered to the multi-pole trap 504 using a dielectric wave guide 528 and microwave horn 530 oriented orthogonal to the trap axis 524 to eliminate the first-order Doppler shift (Lamb-Dicke confinement). Typically, Rabi interrogation is used with Rabi times anywhere between 3 and 65 seconds (s). Once microwave interrogation is complete, ions are shuttled back to the quadrupole trap 502 for state detection using the plasma discharge lamp 510. Fluorescent light exiting the LT 502 through a window 532 perpendicular to the input light (inputted through window 518) is focused by an asphere doublet into a photomultiplier tube (PMT).

Figure 5B:
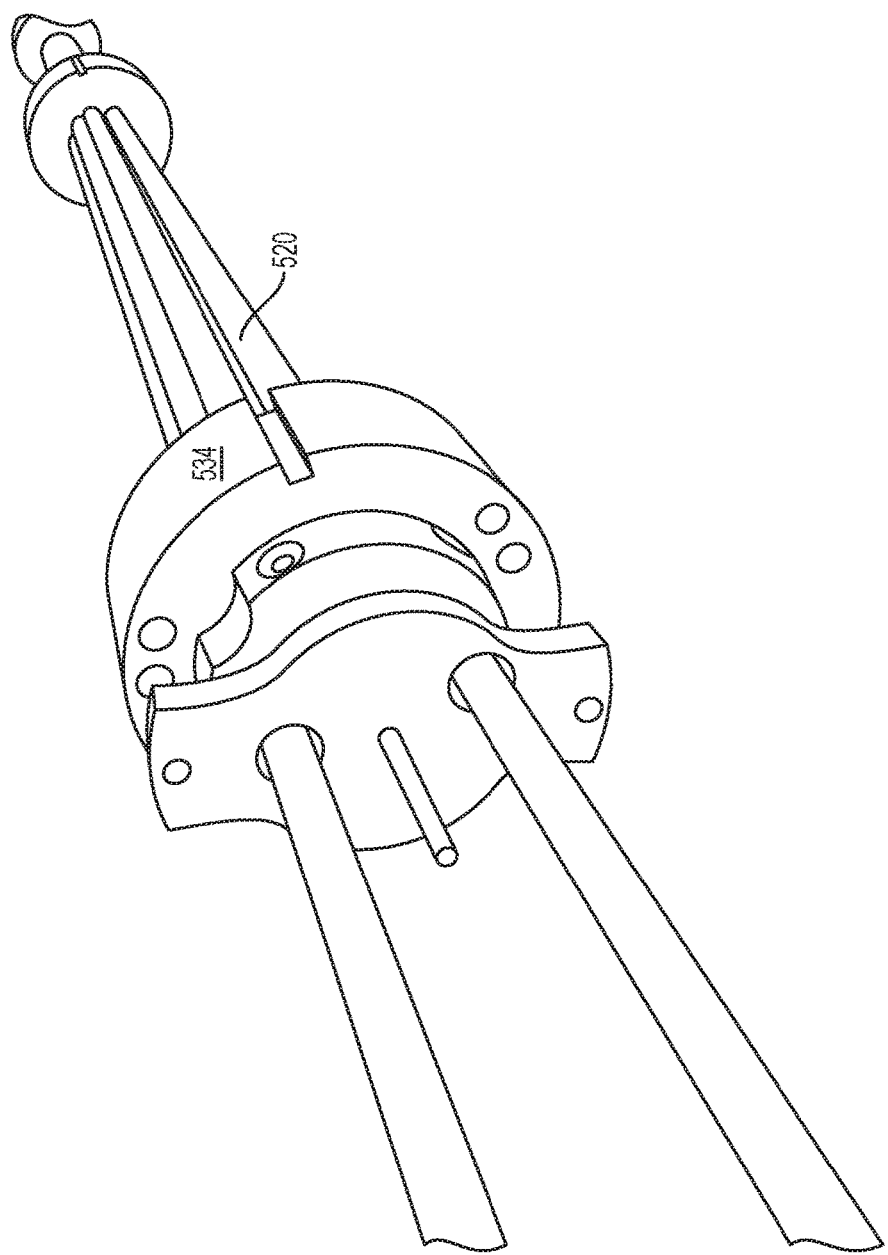
FIG. 5B shows the L10 ion trap viewed from the multi-pole side before insertion into the vacuum chamber and according to one or more embodiments.

FIG. 5B shows the L10 ion trap viewed from the multipole side before insertion into the vacuum chamber 506, illustrating the rods 520 evenly spaced on a circle 534.

Figure 5C:
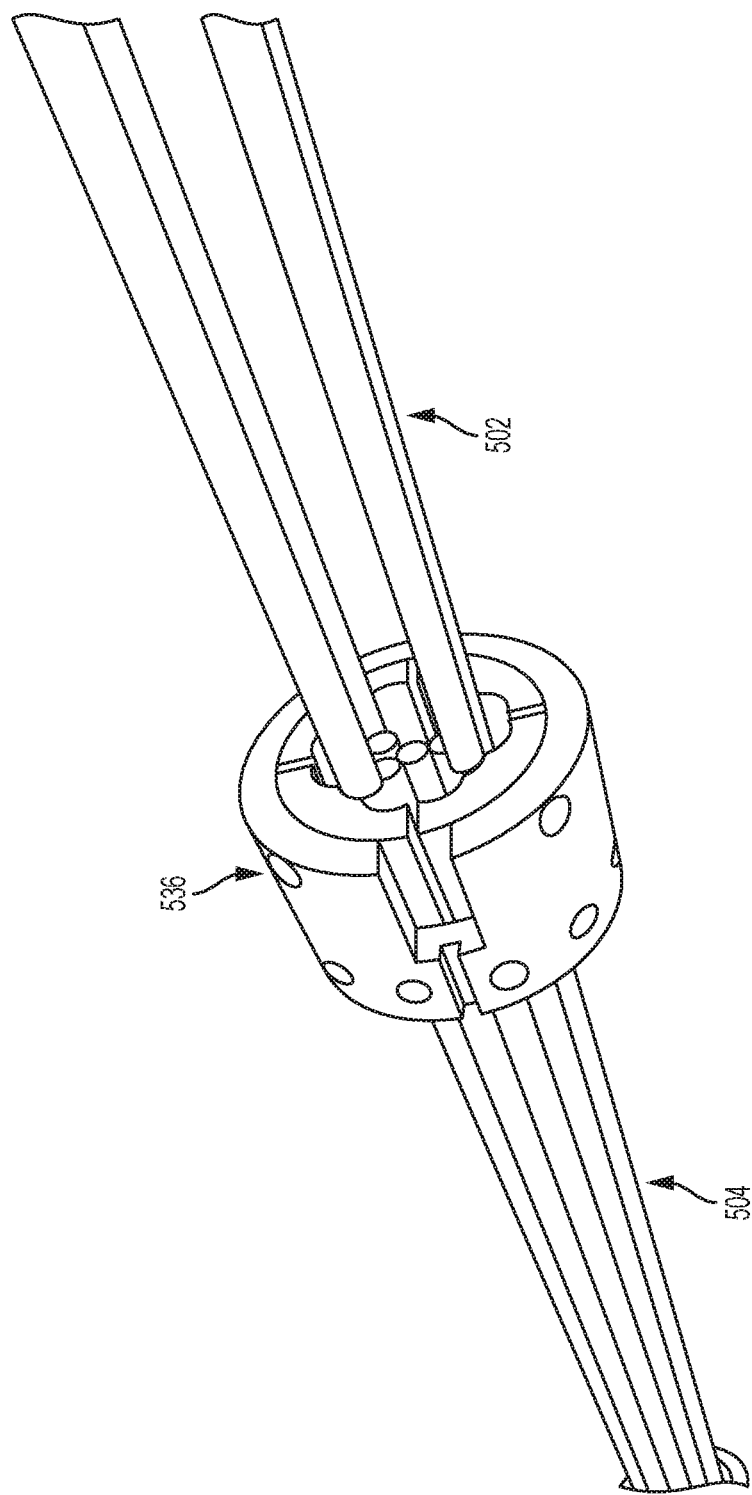
FIG. 5C shows the L10 ion trap transition region between the multi-pole and quadrupole traps before insertion into the vacuum chamber, according to one or more embodiments.

FIG. 5C shows the L10 ion trap transition region or interface region 536 between the multi-pole 504 and quadrupole traps 502 before insertion into the vacuum chamber 506.

Figure 5D:
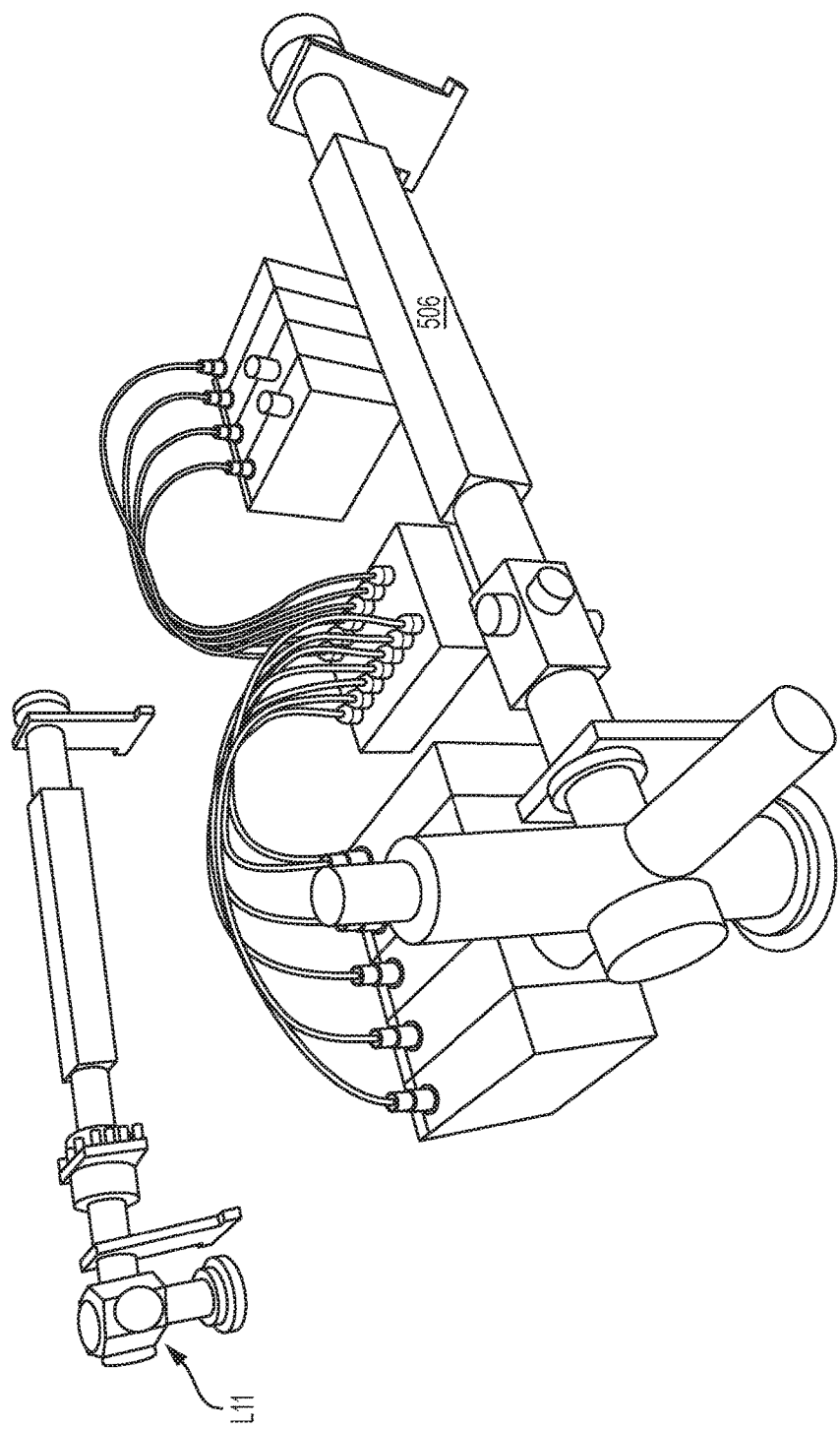
FIG. 5D shows the L10 vacuum tube during assembly, wherein a second identical clock, known as L11, is being assembled in the background and according to one or more embodiments.

FIG. 5D shows the L10 vacuum tube 506 during assembly and a second identical clock, known as L11, being assembled in the background.

Initial Data

After a design and fabrication phase in 2011-2012, L10 became operational in late 2012. In 2013 all subsystems of L10 were individually checked out and system level testing started. Here we give an overview of the results obtained to date.

Atomic Clock System

The L10 physics package was initially configured with a hydrogen maser LO (since this is how it will be operated at NRL). It could just as well be configured with a crystal LO for stand-alone operation (see e.g., [18], [19]).

Figure 6:
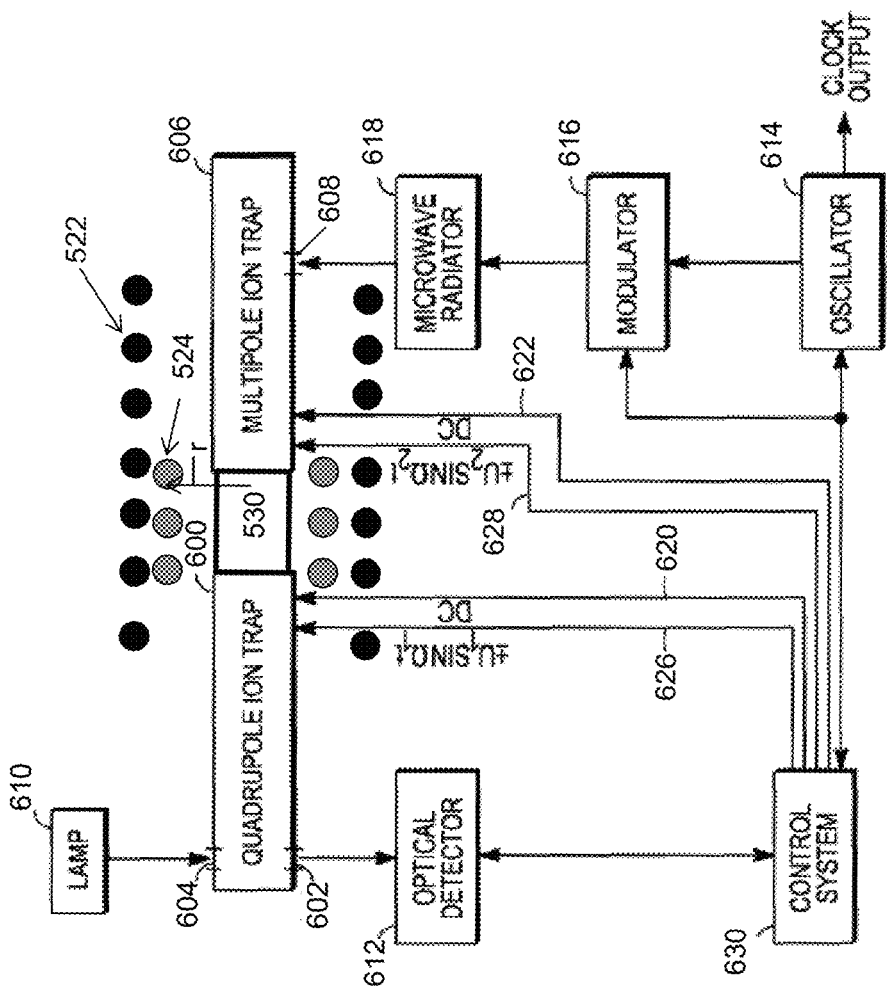
FIG. 6 illustrates a mercury atomic ion clock, represented at the system level, according to one or more embodiments.

The mercury atomic ion clock using L10 may be represented at a system level by FIG. 6, comprising C-field 522 and compensation 524 coils (shown in cross-section), quadrupole ion trap 600, with optical windows 602 and 604, and multipole ion trap 606 with microwave window 608. The source (lamp) of optical radiation is labeled 610, and optical detector 612 measures fluorescence. Oscillator 614 provides a reference frequency $v_0$, which is modulated by modulator 616 to $v_0+\Delta v$ and $v_0-\Delta v$, and microwave radiator 618 interrogates the ions in ion trap 606 via microwave window 608.

A DC voltage ramp is applied to control the ion shuttling between quadrupole ion trap 600 and the multipole ion trap 606. In the embodiment of FIG. 6, the DC voltage ramp to quadrupole ion trap 600 is provided by DC line 620, and the DC voltage ramp to multipole ion trap 606 is provided by DC line 622. These DC voltage lines are connected to the electrodes 520 of their respective ion traps. For some embodiments, typical DC voltage swings may be on the order of a few volts, where the voltage ramp time width may be on the order of a few hundred milliseconds. In addition to the DC voltages, Radio Frequency (RF) voltages for confining the ions in their respective traps are also applied as shown in FIG. 6. RF line 626 provides RF voltages +/−U$_1$ sin Ωt to quadrupole ion trap 600, and RF line 628 provides RF voltages +/−U$_1$ sin Ωt to multipole ion trap 606, wherein U$_1$ is amplitude, Ω is angular frequency, and t is time. A +−. symbol is used in the description of these RF voltages to indicate that each RF line is actually a pair of RF lines, where the two lines making up a pair are driven in opposite phase. These RF voltage lines are connected to the electrodes 520 of their respective ion traps. In practice, the DC voltage may be superimposed (added) to the RF voltages (in which case only one line for DC and RF is used).

Also illustrated in FIG. 6 is controller or control system 630 that is further described below.

Figure 7:
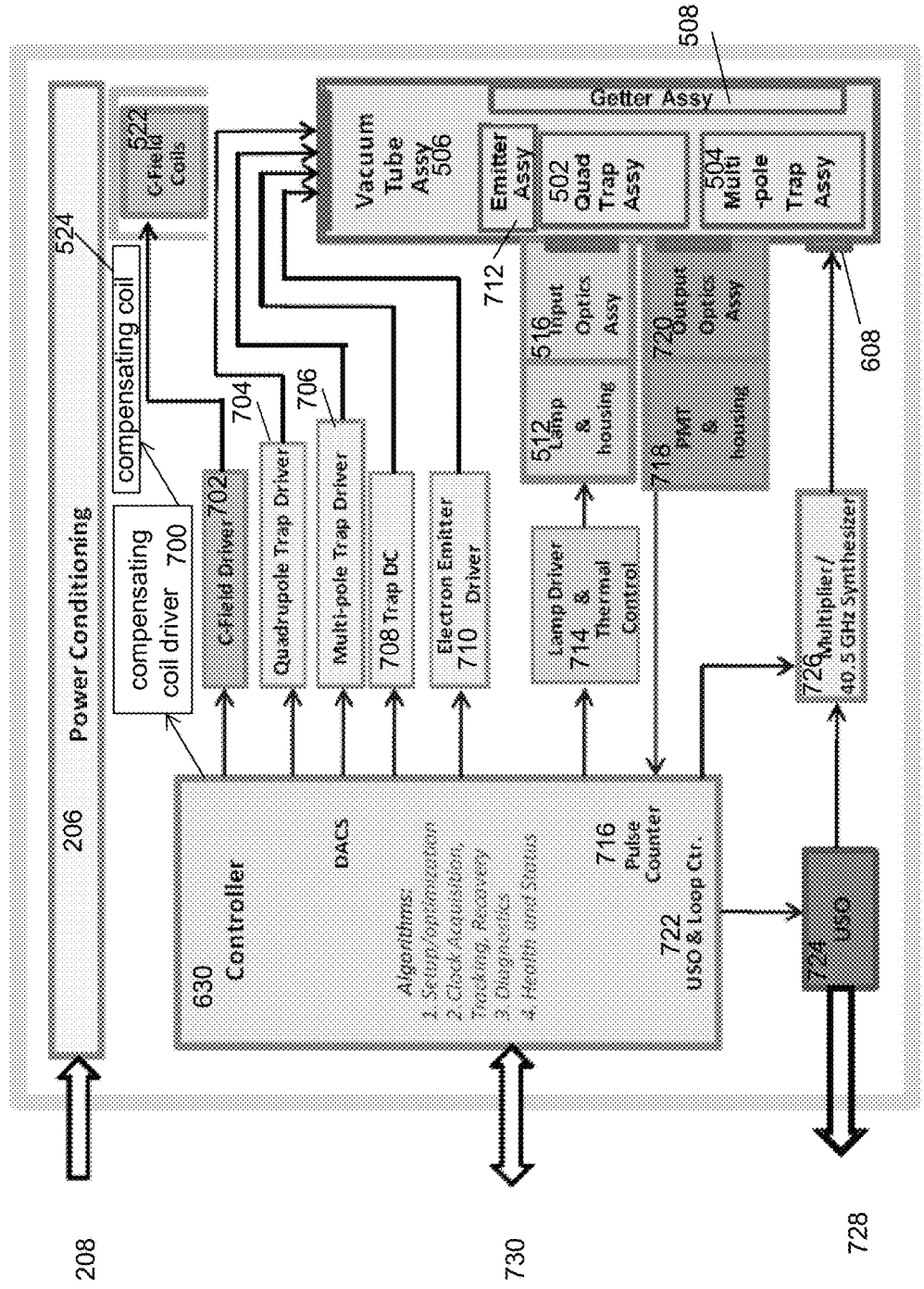
FIG. 7 illustrates a mercury atomic frequency standard, represented at the system level, according to one or more embodiments.

FIG. 7 illustrates a mercury atomic frequency standard showing the controller 630 has a digital to analog converter system (DACS) for interfacing and controlling the compensating coil driver 700, C-field driver 702, quadrupole trap driver 704 (providing RF signals 626), multi-pole trap driver 706 (providing RF signals 628), DC voltage source 708 (providing DC trap voltages to lines 620, 622), electron emitter driver 710 (driving e.g., cathode emitter assembly (assy) 712 that ionizes the mercury gas to form Hg$^+$) and lamp driver and thermal control 714.

The compensating coil driver 700, C-field driver 702, quadrupole trap driver 704, multi-pole trap driver 706, trap DC 708 driver, electron emitter driver 710, and lamp driver 714 are also illustrated as DC electronics 204 in FIG. 2. The DC electronics 204 is powered from power interface 208 via power conditioning 206. Upon instruction from the controller 630, the compensating coil driver 700, C-field driver 702, quadrupole trap driver 704, multi-pole trap driver 706, electron emitter driver 710, and lamp driver 714 provide power to, and control the compensating coil 524, C-field coil 522, quadrupole (quad) trap assembly (assy) 502, multi-pole trap assy 504, electron emitter 712, and lamp 510, respectively. For example, the quadrupole trap drive 704 and multi-pole trap driver 705 can provide required trapping and/or shuttling voltages to the quad trap 502 and multi-pole trap 504, the compensating coil driver 700 and the C-field driver can provide coil current bias levels to the compensating coil 524 and C-field coil 522, respectively, thereby controlling the C-field and compensating field, and the lamp driver can provide lamp biasing to control illumination of the lamp 510).

FIG. 7 further illustrates the controller 630 comprises a pulse counter 716 counting the photons in the fluorescence detected by the PMT 718 through the output optics assy 720.

FIG. 7 further illustrates the controller 630 comprises an Ultra Stable Oscillator (USO) and loop counter (ctr) 722 for controlling a USO 724, wherein the USO is an LO generating electromagnetic radiation that is converted via multiplier/40.5 GHz synthesizer 726 to output the electromagnetic radiation (microwaves 526) that interrogate the resonance frequency of the clock transition 400 through window 608. USO can output a clock output 728 comprising the resonance frequency of the clock transition 400.

Also shown is the vacuum tube assy 506, getter assy 508, command/control interface 730 to the controller 630, and power interface 208 (e.g., power source).

Controller 630 can be an FPGA controller as illustrated in FIG. 3. The controller can implement setup/optimization, clock acquisition, tracking, and recovery, diagnostics, and health and status checks.

Shuttling Efficiency

Figure 8:
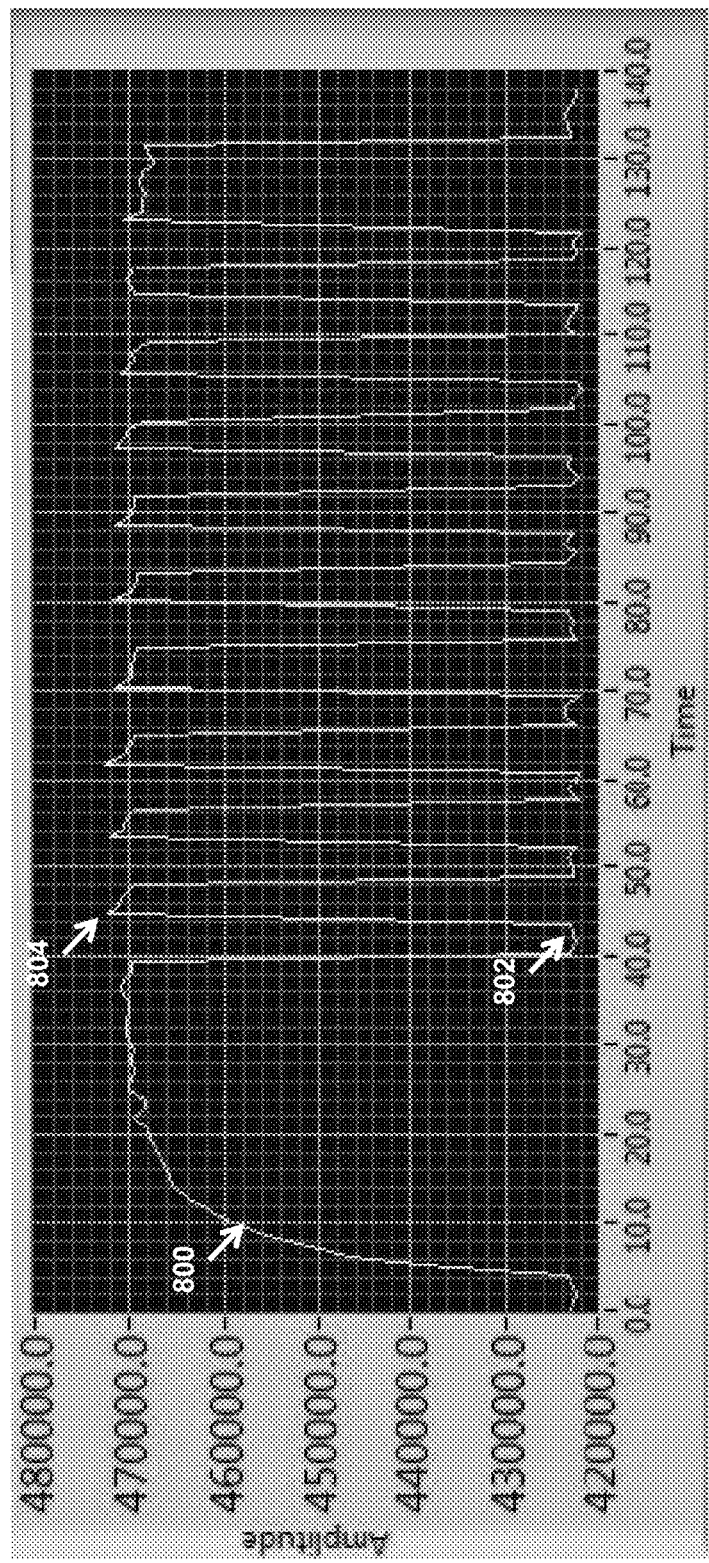
FIG. 8 is a screen shot showing multiple shuttling of the same group of ions between the quadrupole and multi-pole traps and excellent control of the shuttling process, according to one or more embodiments, wherein the graph shows fluorescence versus time, initially the ions are loaded into the quadrupole trap (where the detection region is) with an exponential time constant, the fluorescence disappears as ions are moved out of the quadrupole trap, and 100% of the fluorescence reappears when the ions are moved back, indicating a complete transfer of ions.

"Shuttling" is the process of electro-magnetically moving ions from the quadrupole trap (LT, 502), in which they are loaded, to the multi-pole trap (RT, 504) where sensitive clock microwave interrogation takes place. This process has two key benefits: 1) during critical clock operation, the ions are well away from perturbing effects such as residual un-blocked light from the light source, and 2) it places the ions in the multi-pole trap, making the clock largely immune to changes in ion number. It is easier to load and state prepare ions in the quadrupole trap and shuttling allows the unique benefits of both traps to be used in the same clock. It is essential and not trivial to move 100% of the ions back and forth between the two traps. FIG. 8 shows ions being shuttled between the quadrupole trap 502 and the multi-pole trap 504 many times, demonstrating 100% efficiency on a single transfer and near 100% efficiency even after 10 transfers of the same group of ions. The graph in FIG. 8 shows fluorescence (amplitude) versus time (seconds) as measured by the PMT. Initially the ions are loaded into the quadrupole trap 502, 600 (where the detection region is) with an exponential 800 time constant. As the ions are moved out of the quadrupole trap 502, 600, the fluorescence disappears 802. When the ions are moved back in the quadrupole trap 502, 600, 100% of the fluorescence reappears 804 (indicating a complete transfer of ions).

Clock Operation and Performance

The component systems (drivers 700-710,712, traps 502, 504, coils 522, 524, oscillator 614, modulator 616, radiator 618, PMT, and lamp 510) and their outputs (DC, RF voltages 620, 622, 626, 628, magnetic fields of compensation coil 524 and C-field coil 522, frequency of oscillator 614, modulator 616, and microwave radiator 618, fluorescence measured in the optical detector 612, and illumination of lamp 610) are monitored and/or controlled by control system 630 so that clock performance can be operated as follows. During state selection and detection, the $^{202}$Hg$^+$ discharge 510,610 lamp generates ultraviolet light at 194 nm to optically pump the trapped $^{199}$Hg$^+$ ions in the LT trap 502, 600 into the $S_{1/2}$, F=0, mF=0 ground state hyperfine level, by driving the $S_{1/2}$, F=1 to $P_{1/2}$, F=1 transition. The optically excited $^{199}$Hg$^+$ ions eventually decay back into the desired ground state hyperfine level, producing fluorescence. The discharge lamp 510, 610 is then dimmed to avoid an AC Stark shift, the ions are transferred to the multipole trap 504, 606 and an interrogating microwave field at approximately 40.507 GHz, derived from a local oscillator, drives the $S_{1/2}$, F=0, mF=0 to $S_{1/2}$, F=1, mF=0 clock transition. After interrogation, the ions are transferred back to the LT trap 502, 600 and the lamp 510, 610 is again brightened, and fluorescence given off by ions excited by this light is used for state detection. The optical detector 612, such as the PMT tube, measures the fluorescence during state detection and the detected fluorescence indicates the degree to which ions were excited during microwave interrogation and therefore the degree to which the microwave interrogation frequency was on resonance with the clock transition.

In one embodiment, these component systems are monitored and controlled by control system 630, so that the frequency of oscillator 614 is controlled to provide equal fluorescence responses at the two frequencies $v_0+\Delta v$ and $v_0-\Delta v$. The output 728 of oscillator 614 provides a stable frequency reference to be used as the basis for an atomic clock (a clock will count the cycles, and add one second after an appropriate number of cycles of the resonance frequency of the clock transition 400 have been accumulated).

Figure 9:
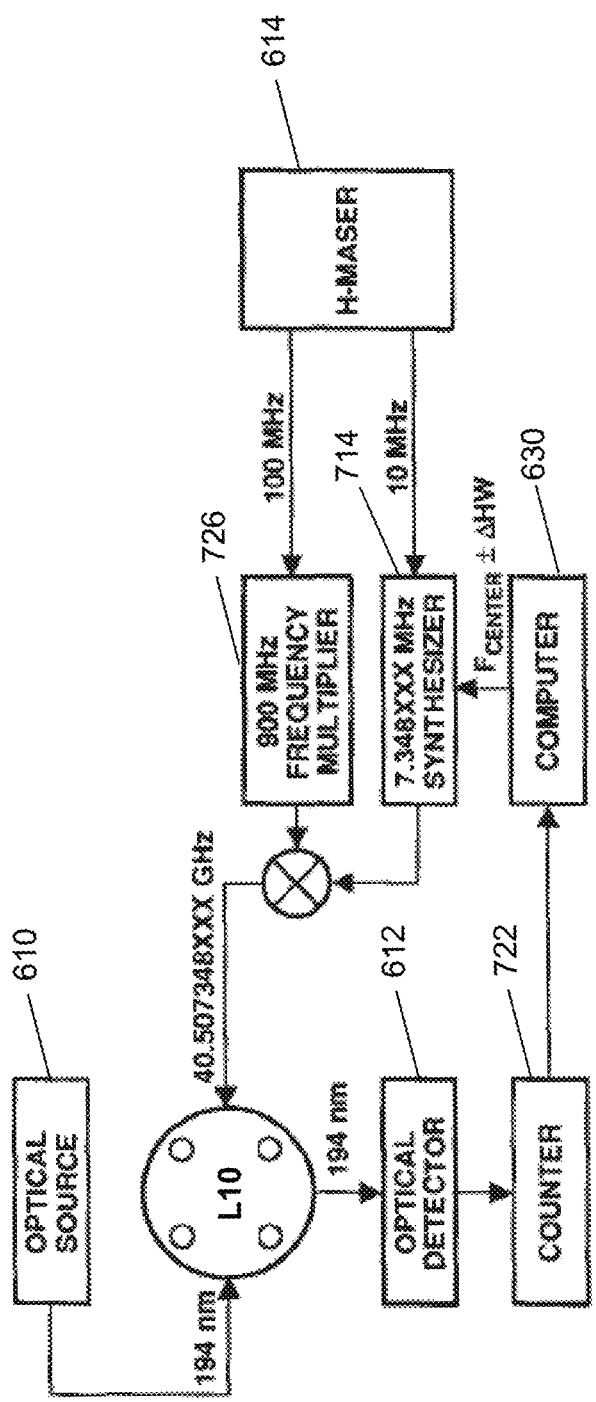
FIG. 9 illustrates a system for operating the L10 clock using a hydrogen maser according to one or more embodiments.
Figure 10:
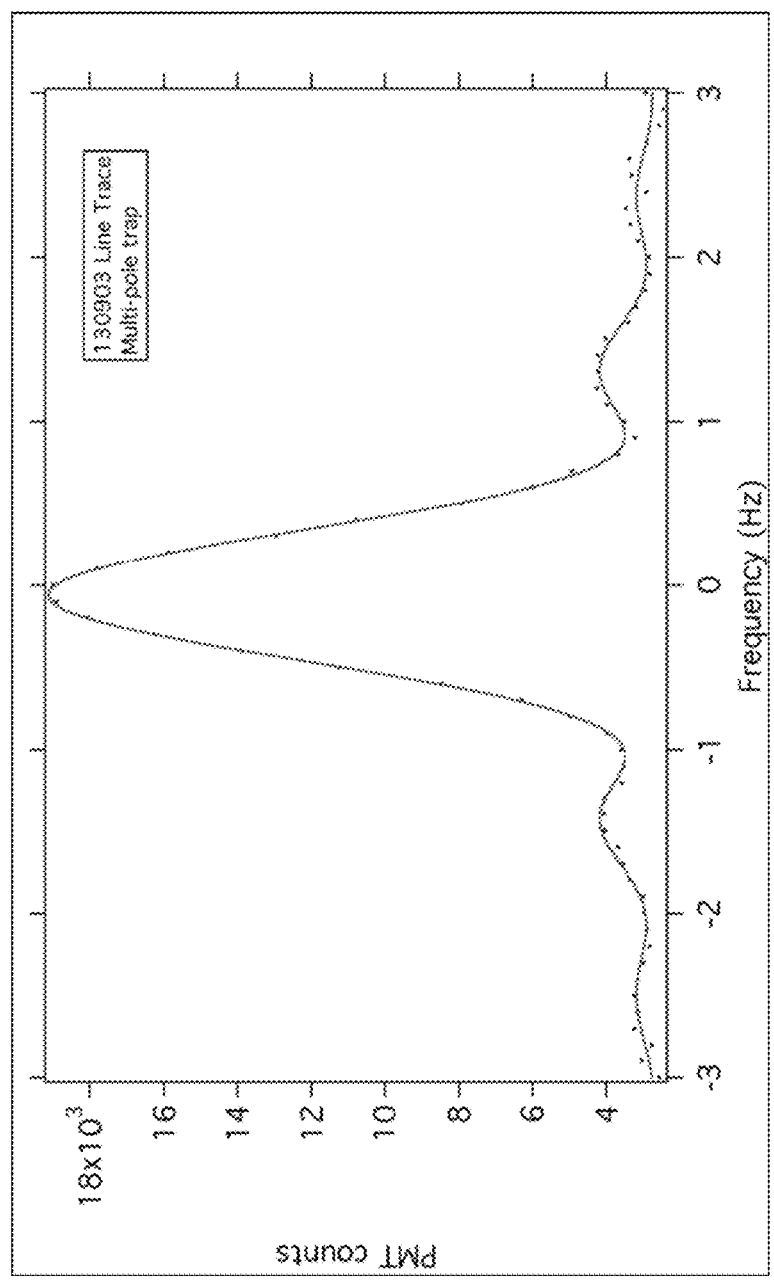
FIG. 10 shows a microwave frequency scan across the Hg+ clock transition in L10 using the system of FIG. 7 and according to one or more embodiments.

Using a maser LO as illustrated in FIG. 9, FIG. 10 shows intensity of fluorescence (photons count measured by PMT or PMT count) from ions in the LT trap 502 measured on the PMT as a function of the scan of the microwave interrogation frequency across the F=0, m=0-F=1, m=0 clock transition (specifically, PMT signal as a function of frequency offset from the center frequency (approximately 40.507 GHz) of the interrogating microwave radiation). This particular scan used Rabi interrogation with a 1 second Rabi time resulting in a 0.8 Hz Full Width at Half Maximum (FWHM).

Figure 11:
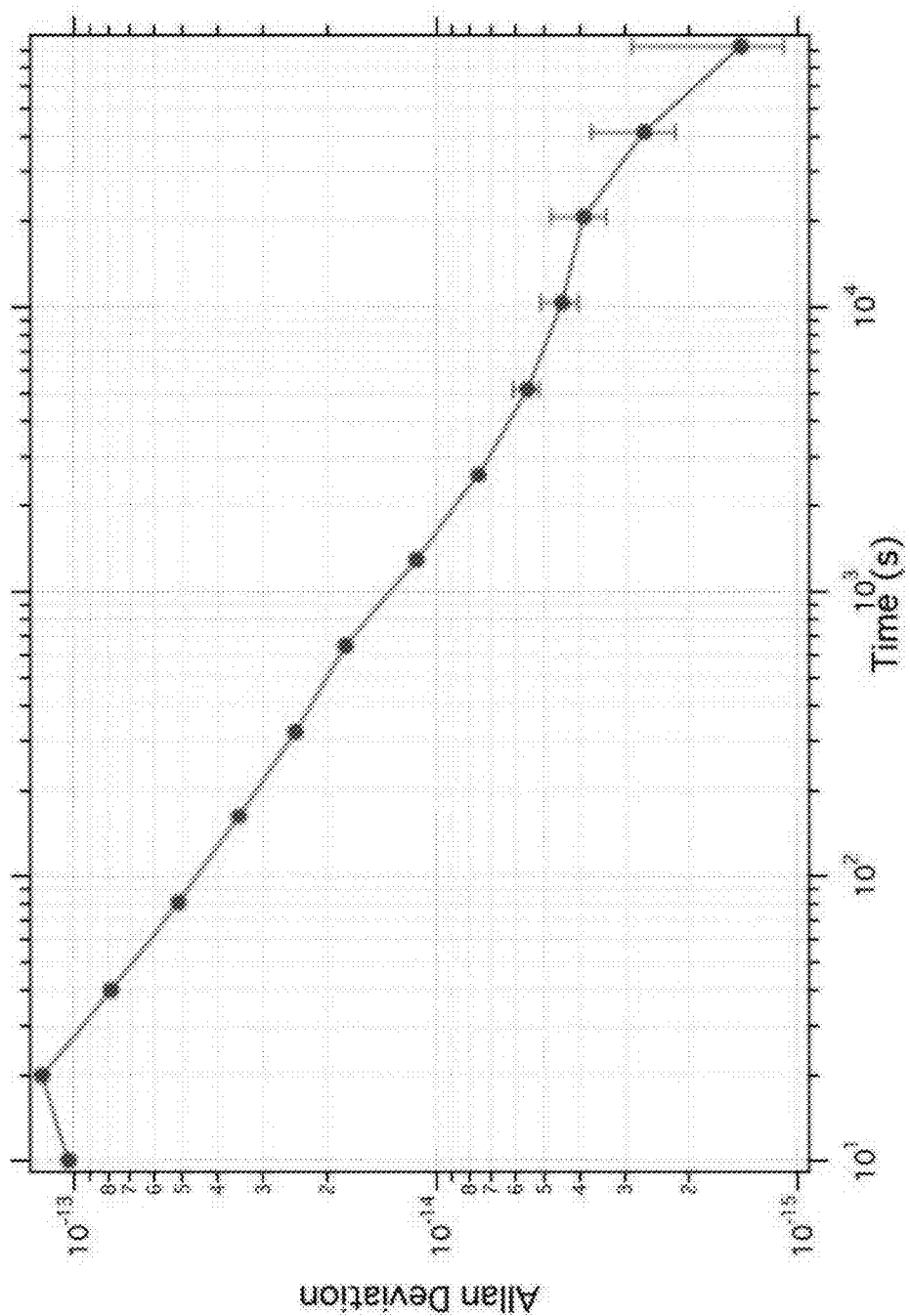
FIG. 11 plots Allan Deviation of fractional frequency differences between L10 and its maser LO (using the system of FIGS. 5, 6, 7, and 9) using a 2 second Rabi time and 1 detection arm, according to one or more embodiments.

FIG. 11 shows the short term Allan Deviation of frequency differences between L10 and the maser LO. Here, the clock is operating with a 2 second Rabi interrogation time. Data past 1 day of averaging is not shown because it is simply dominated by maser drift. This Allan Deviation shows a modest short-term stability of about $4.5 \times 10^{-13}/\tau^{1/2}$. Better short-term stability will be achieved by increasing the interrogation time from the current 2 s to 10-20 s and by the addition of a second detection arm. The Allan variance can be measured using the formula for Allan variance [19]:

$$\sigma_y^2(\tau) = \frac{1}{2} \langle (\Delta y)^2 \rangle$$

where $\langle (\Delta y)^2 \rangle$ is an average over n measurements of $\Delta y_n$, $\Delta y_n = y_{n+1} - y_n$, $y_n = (x_{n+1} - x_n)/\tau$, $\tau$ is the time interval between the n+1$^{th}$ and n$^{th}$ measurement, and $x_n$ and $x_{n+1}$ are the frequency differences between L10 and the maser LO measured at the n$^{th}$ and n+1$^{th}$ time interval, respectively. The Allan deviation is the square root of the Allan variance.

To date, we do not yet have long-term stability data for L10; only comparisons to a maser, which is dominated by maser drift after about 1 day of averaging time. However, the unit has been moved into the JPL frequency standards test lab where it is steering the output of a maser. This output can be used to reference a Global Positioning System (GPS)

timing receiver, enabling comparison, via GPS, to Coordinated Universal Time (UTC) over a period (e.g., 30-day period).

Process Steps

Figure 12:
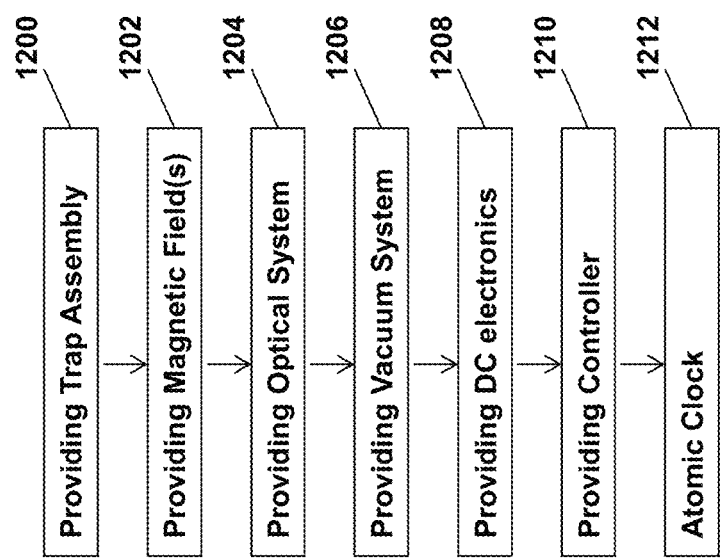
FIG. 12 is a flow chart illustrating a method of fabricating an apparatus according to one or more embodiments of the invention.

FIG. 12 is a flow chart illustrating a method of fabricating an apparatus used in an atomic clock to obtain a frequency standard. The method may comprise one or more of the following steps.

Block 1200 represents providing an ion trap assembly (e.g., LT trap 502 and RT trap 504) for trapping a number of ions participating in a clock transition and wherein a resonance frequency of the clock transition can be interrogated in an interrogation region of the ion trap assembly (e.g., RT trap) using electromagnetic radiation. The ion trap assembly can comprise a LT trap 502 connected to the RT trap 504 (e.g., to form a linear ion trap), wherein the ions can be transferred between the LT trap 502 and the RT trap 504.

Block 1202 represents providing one or more magnetic fields or sources of magnetic fields. The step can comprise positioning one or more current conductors (e.g., C-field coil or solenoid 524 and compensation coil 524 or solenoid) that can generate a magnetic field in the interrogation region (e.g., RT), wherein the magnetic field (e.g., combination of the first magnetic field generated by the C-field coil and second magnetic field generated by the compensation coil) produces an ion number-dependent second order Zeeman shift (Zeeman shift) in the resonance frequency that is opposite in sign to an ion number-dependent second order Doppler shift (Doppler shift) in the resonance frequency. One of the current conductors (e.g. in the C-field coil) can be positioned at a distance from a center of the interrogation region (e.g. the C-field coil can have a radius), wherein the distance (or radius of the C-field coil) is selected using data indicating how changes in the distance (radius) affect (e.g., as compared to other radii or distances) an ion-number-dependent shift in the resonance frequency, such that a difference in magnitude between the Doppler shift and the Zeeman shift is controlled, reduced, at least partially canceled, or cancelled. The first and/or second magnetic fields can include magnetic inhomogeneities. Thus, the combination of first and second magnetic fields can control a slope (as a function of ion number) and/or offset (or magnitude) of the ion number dependent shift (e.g., including Zeeman shift) in the resonance frequency, thereby offsetting or canceling the ion number dependent second order Doppler shift.

If the C-field solenoid radius is small and the effect of changing ion number due to the magnetic field has the opposite sign (positive with increasing ion number) but a larger magnitude than that of the second order Doppler effect, the net ion-number-dependent shift would be positive with increasing ion number. In one or more embodiments of the present invention, the C-field solenoid radius is tuned so that the magnetic effect is equal in magnitude but opposite in sign to that of the relativistic effect. However, the minimum field that this type of clock can reliably operate at, to avoid decoherence due to coupling between Zeeman lines and motional side bands, is about 60 milliGauss (mG). To operate at this field magnitude while compensating the number-dependent second order Doppler shift would require an unacceptably large C-field solenoid radius. Thus, in one or more embodiments, the L10 C-field solenoid radius is as large as possible within limits set by overall size constraints such that the demand on the additional compensation coil is minimized or reduced.

For example, the step can comprise measuring (as shown in FIG. 1) or calculating how changes in the C-field coil's radius and/or magnetic field affect an ion-number-dependent shift in the resonance frequency, and selecting the radius (e.g., from other radii) and/or magnetic field of the C-field coil based on this data (e.g., to minimize, reduce, control, at least partially cancel, or cancel the difference in magnitude between the Doppler shift and Zeeman shift).

The step can comprise measuring or calculating how changes in the compensation coil's radius and/or magnetic field affect an ion-number-dependent shift in the resonance frequency, and selecting the radius and/or magnetic field of the compensation coil that produces a Zeeman shift that is opposite in sign, reduces, cancels, or at least partially cancels, the Doppler shift.

The radius R of the C-field solenoid and/or the radius r of the compensation coil can be increased to a value that takes into account an overall size constraint for the apparatus, current that can be passed through the current conductors (e.g., compensation coil), and such that the combination of the magnetic fields has a field strength of more than 60 milliGauss. For example, the apparatus can fit within a volume of 36 inches long (L) by 18 inches wide (W) by 18 inches high (H) (see FIG. 5A for examples of L, W and H). The radius can be increased by an amount such that varying the ion number by 36% includes a factor of 2 reduction in the ion number-dependent second order shift as compared to without the radius increase. The radius R and/or r can be selected such that a variation of the ion number by 36% would result in an ion number dependent second order shift of at most 1.1(2) milli Hertz. The result of 1.1(2) mHz is a factor of two times (2×) smaller than that for the same number change in LITS-9 (because the L10 C-field solenoid has a larger radius).

The combination of the magnetic fields and the C-field coil radius can be selected to maintain or increase the number of the ions participating in the clock transition, taking into account decoherence due to coupling of Zeeman levels and motional side bands. For example, the C-field coil radius and biasing can produce the magnetic field experienced by the ions of at least 60 mG.

The ion trap assembly and the compensation coil can be positioned inside or within, or be surrounded by the C-field coil. The interrogation region may be inside or within or surrounded by, the compensation coil. The compensation coil may be positioned and dimensioned to surround an interface between the LT trap and the RT trap.

The position of the compensation coil and second magnetic field strength can be selected to increase uniformity of the magnetic field experienced by the ions and/or produce the Zeeman shift and Doppler shift that are opposite in sign.

Block 1204 represents providing an optical system. The step can comprise positioning a first refractive optic for inputting ultraviolet electromagnetic radiation to electromagnetically pump the ions into a ground state of the clock transition in the LT trap. The step can comprise positioning a second refractive optic for collecting fluorescence generated by the ions after excitation in the LT trap by the ultraviolet electromagnetic radiation but after the interrogation of the resonance frequency in the RT trap. The first and second refractive optics can comprise first and second aspheric doublets. The step can comprise designing the first aspheric doublet to reduce unwanted scattering off of nearby surfaces and to image the electromagnetic radiation, comprising diffuse mercury plasma discharge having a wavelength of 194 nm, onto an ion cloud comprising the ions in the LT trap.

Block 1206 represents providing a vacuum system. The step can comprise placing the apparatus in a vacuum chamber, the vacuum chamber comprising a first window for inputting ultraviolet electromagnetic radiation to electromagnetically pump the ions into a ground state of the clock transition in the LT trap, a second window for inputting microwave radiation into the RT trap to interrogate the resonance frequency, and a third window for outputting fluorescence generated by the ions after excitation in the LT trap by the ultraviolet electromagnetic radiation but after the interrogation in the RT trap. The step can comprise baking out (e.g, heating) the vacuum chamber comprising the apparatus at a temperature of more than 200° C., more than 400° C., or more than 450° C.

The step can comprise providing the vacuum chamber comprising a buffer gas (e.g., cooling gas used to cool the ions) and a getter that reduces pressure of unwanted background gases (e.g., methane) in the vacuum chamber. The step can comprise allowing the vacuum chamber to equilibrate for a time (or controlling the equilibration time) until methane gas evolution in the sealed chamber is no more than $6 \times 10^{-16}$ torr/second; and wherein pressure in the vacuum chamber one day after sealing is no more than $1 \times 10^{-16}$ torr and the ions' lifetime in the traps includes one day (or at least one day) without replenishing the buffer gas. The step may comprise measuring/monitoring the pressure of unwanted background gases so that the equilibration time can be determined. The step may comprise providing a hot filament in the vacuum system to crack methane, for example biasing the electron emitter used to ionize the mercury gas, such that methane in the vacuum system is cracked into hydrogen and carbon.

The radius of the C-field coil can be selected such that a shift in the resonance frequency due to the pressure is greater than the second order Doppler shift.

The vacuum chamber housing (excluding windows) can consist essentially of titanium.

Block 1208 represents providing DC electronics. The step can comprise providing DC powered electronics comprising current source(s) for biasing and controlling the current conductors to produce the first and second magnetic fields (e.g., first current source for biasing and controlling the C-field coil and a second current source for biasing and controlling the compensation coil), wherein one or more of the current sources have a temperature coefficient of at most 500 parts per billion. The step can comprise providing DC powered electronics that provide trapping voltages 620, 622, 626, 628 to the ion traps 502, 504, provide power to an optical source 512 used to optically pump the ions into a ground state of clock transition 400, provide power to the electron emitter 712 used to create the ions, and provide power to an LO used to interrogate the resonance frequency. Drivers 700, 702, 704, 706, 708, 710, 714 can be DC electronics. LO can be DC powered.

Block 1210 represents providing a controller (e.g, computer or one or more processors). The step can comprise providing a controller including an FPGA, wherein the FPGA controls the DC powered electronics and a frequency of the LO used to interrogate the resonance frequency. The controller can control or tune the current provided to the magnetic field sources (C-field coil and/or compensation coil) such that magnetic field in the interrogation regions produces the ion number dependent Zeeman shift that cancels or reduces the ion number dependent Doppler shift or otherwise reduces, cancels, or at least partially cancels the ion number dependent second order shift.

Block 1212 represents the end result, an apparatus comprising an ion trap assembly for trapping a number of ions participating in a clock transition and wherein a resonance frequency of the clock transition can be interrogated in an interrogation region of the ion trap assembly using electromagnetic radiation; one or more current conductors (e.g., C-field coil positioned for generating a first magnetic field in the interrogation region and a compensation coil positioned for generating a second magnetic field in the interrogation region), wherein the combination of the magnetic fields generated by the current conductors produces the ion number-dependent second order Zeeman shift (Zeeman shift) in the resonance frequency that is opposite in sign to the ion number-dependent second order Doppler shift (Doppler shift) in the resonance frequency and a difference in magnitude between the Doppler shift and the Zeeman shift is controlled, reduced, at least partially canceled, or canceled. The resonance frequency, including the adjustment by the Zeeman shift or ion number dependent second order shift, is used to obtain the frequency standard.

The end result can further comprise an atomic clock comprising the apparatus coupled to a local oscillator for interrogating the resonance frequency, $^{199}$Hg$^+$ ions trapped in the trapping assembly so that the clock based on the $^{199}$Hg$^+$ clock transition, refractive optics for coupling electromagnetic radiation into and out of the apparatus for state preparation, detection, and interrogation, and DC electronics and a controller for controlling the operation of the atomic clock. The resonance frequency and the LO frequency can have an Allan Deviation of at most $4.5 \times 10^{-13}/\tau^{1/2}$ ($\tau$ is $10^5$ seconds or less) and/or the atomic clock can consume a power of less than 40 Watts.

Advantages and Improvements

Over the past decade, trapped ion atomic clock development at the JPL has focused on two directions: 1) new atomic clock technology for space flight applications that require strict adherence to size, weight, and power requirements, and 2) ultra-stable atomic clocks, usually for terrestrial applications, emphasizing ultimate performance.

One or more embodiments of the present invention disclose a new ultra-stable trapped ion clock designed, built, and tested in the second category. The first new standard, L10, will be delivered to the NRL for use in characterizing Department of Defense (DoD) space clocks.

One or more embodiments of the invention have described the development of a new compensated multi-pole trapped ion atomic clock, L10, for future reference use at the NRL. This new clock has several design improvements over its predecessor, LITS-9, most notably, engineered compensation of relativistic ion number dependent effects, improved vacuum, improved magnetic design, increased optical efficiency, and reduced mass, power, and volume. L10 is operating and is in the process of long-term evaluation. An identical copy of this clock has been built and will operate at JPL. The expected long-term stability of these units will be useful in characterizing other atomic clocks at NRL as well as in characterizing masers for use in NASA's Deep Space Network. In the 2016 time frame one of these units will also serve as an ultra-stable reference for the ACES microwave link ground terminal installed at JPL [15].

REFERENCES

The following references are incorporated by reference herein.

[1] D. Matsakis, P. Koppang, and R. M. Garvey, Proceedings of the 36th PTTI (2004).

[2] R. L. Tjoelker, J. D. Prestage, P. A. Koppang, T. B. Swanson, "Stability Measurements of a JPL Multi-pole Mercury Trapped Ion Frequency Standard at the USNO,"

proceedings of the 2003 Joint Meeting of the 17th EFTF and 58th Ann. Symp. On Frequency Control, Tampa, Fla.; May 5-8, 2003.

[3] E. A. Burt, W. A. Diener and R. L. Tjoelker, IEEE TUFFC 55, 2586 (2008).

[4] R. L. Tjoelker, C. Bricker, W. Diener, R. L. Hamell, A. Kirk, P. Kuhnle, L. Maleki, J. D. Prestage, D. Santiago, D. Seidel, D. A. Stowers, R. L. Sydnor, T. Tucker, "A Mercury Ion Frequency Standard Engineering Prototype for the NASA Deep Space Network," proceedings of the 50th Annual IEEE IFCS, Honolulu, Hi. Jun. 5-7, 1996.

[5] J. D. Prestage, R. L. Tjoelker, and L. Maleki, "Higher Pole Linear Traps for Atomic Clock Applications," proceedings of the 1999 Joint Meeting EFTF-IEEE IFCS.

[6] E. A. Burt, D. G. Enzer, R. T. Wang, W. A. Diener, and R. L. Tjoelker, proceedings of the 2006 PTTI, Reston, Va. (2006).

[7] G. Petit, "Atomic time scales TAI and TT(BIPM): present performances and prospects," Highlights of Astronomy 15, 220 (2010).

[8] E. A. Burt, S. Taghavi, J. D. Prestage, and R. L. Tjoelker, Proceedings of the 2008 IFCS, Hawaii (2008).

[9] T. M. Fortier, et al., Nature Photonics 5, 425 (2011).

[10] R. L Tjoelker, E. A. Burt, S. Chung, R. L. Hamell, J. D. Prestage, B. Tucker, P. Cash, and R. Lutwak, "Mercury atomic frequency standards for space based navigation and timekeeping," proceedings of the 43rd annual PTTI (2011).

[11] J. D. Prestage, S. Chung, L. Lim, and T. Le, Proceedings of the 38th PTTI (2006); LITS-9 was also modified to operate with a sealed vacuum pumped by a getter and ran that way for a year. Its stability during that period was comparable to that of its mechanically pumped version.

[12] S. K. Chung, J. D. Prestage, and R. L. Tjoelker, Proceedings of the 2004 IEEE IFCS (2004);

[13] L. Yi, S. Taghavi-Larigani, E. A. Burt, and R. L. Tjoelker, Proceedings of the 2012 IEEE IFCS (2012).

[14] G. L. Shen, "The pumping of methane by an ionization assisted Zr/Al getter pump," J. Vac. Sci. Technol. A 5, 2580 (1987).

[15] L. Cacciapuoti and C. Salomon, Journal of Physics: Conference Series 327, 012049 (2011).

[16] U.S. Pat. No. 8,026,768 by Burt et. al.

[17] U.S. Pat. No. 8,058,936, by Prestage et. al., entitled ATOMIC ION CLOCK WITH TWO ION TRAPS, AND METHOD TO TRANSFER IONS."

[18] Ultra Stable He trapped ion frequency standard, J. D. Prestage et. al., Journal of Modern Optics, 1992, vol. 39, no. 2, p. 221-232.

[19] U.S. Pat. No. 5,420,549 by Prestage et. al., entitled "Extended Linear Ion Trap Frequency Standard Apparatus."

[20] The Science of Timekeeping, Application Note 1289, downloaded from http://www.allanstime.com/Publications/DWA/Science_Timekeeping/TheScienceOfTimekeeping.pdf, by David Allan et. al.

[21] Next Generation Space Atomic Clock, J. Prestage, Stanford 2011 PNT Challenges and Opportunities.

[22] Characterization and Reduction of Number Dependent Sensitivity in Multi-polar Linear Ion trap Standards, Burt et. al. Proc. 2005 IEEE Int. Frequency Control Symp., Vancouver, Canada, pp. 466-471.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for fabricating an apparatus used in an atomic clock to obtain a frequency standard, comprising:
   positioning a C-field coil for generating a first magnetic field in the interrogation region;
   positioning a compensation coil for generating a second magnetic field in the interrogation region, wherein:
   a combination of the first and second magnetic fields produces an ion number-dependent second order Zeeman shift in the resonance frequency that is opposite in sign to an ion number-dependent second order Doppler shift in the resonance frequency;
   the C-field coil has a radius selected using data indicating how changes in the radius affect an ion-number-dependent shift in the resonance frequency, providing the C-field coil with built-in compensation such that a variation of the number of the ions by 36% would result in the ion-number-dependent second order Doppler shift of at most 1.1(2) mHz when the second magnetic field is off;
   the resonance frequency, including an adjustment by the second order Zeeman shift, is used to obtain the frequency standard; and
   the combination of the first and second magnetic fields is selected taking into account decoherence due to coupling of Zeeman levels and motional side bands.

2. The method of claim 1, wherein the radius is larger than a radius of the C-field coil in a LITS-9 standard, and the combination of the magnetic fields has a field strength of more than 60 milliGauss (mG).

3. The method of claim 2, wherein the apparatus fits within a volume of 36 inches long by 18 inches wide by 18 inches high.

4. The method of claim 1, wherein the ion trap assembly comprises a first trap connected to a second trap, the method further comprising:
   placing the apparatus in a vacuum chamber, the vacuum chamber comprising:
   a first window for inputting ultraviolet electromagnetic radiation to electromagnetically pump the ions into a ground state of the clock transition in the first trap,
   a second window for inputting microwave radiation into the second trap to interrogate the resonance frequency, and
   a third window for outputting fluorescence generated by the ions after excitation in the first trap by the ultraviolet electromagnetic radiation and after the interrogation in the second trap; and
   baking out the vacuum chamber comprising the apparatus at a temperature of more than 200° C.

5. The method of claim 4, wherein the temperature is more than 400° C.

6. The method of claim 4, further comprising:
   providing the vacuum chamber comprising a buffer gas and a getter that reduces pressure of unwanted background gases in the vacuum chamber; and
   allowing the vacuum chamber to equilibrate for a time until methane gas evolution in the sealed chamber is no more than $6 \times 10^{-16}$ Torr/second; and wherein:

pressure in the vacuum chamber one day after sealing is no more than $1\times10^{-11}$ Torr, and the ions' lifetime in the traps includes at least one day without replenishing the buffer gas.

7. The method of claim 6, wherein the vacuum chamber has a housing consisting essentially of titanium.

8. The method of claim 6, further comprising selecting the radius such that a shift in the resonance frequency due to the pressure is greater than the Doppler shift.

9. The method of claim 1, further comprising providing a first current source for biasing the C-field coil and a second current source for biasing the compensation coil, wherein the current sources have a temperature coefficient of at most 500 parts per billion.

10. The method of claim 9, further comprising providing Direct Current (DC) powered electronics that provide trapping voltages to the ion traps for trapping the ions in the ion trap assembly, drive or power the current sources, drive or power an optical source used to electromagnetically pump the ions into the ground state of clock transition, drive or power an electron emitter used to create the ions, and drive or power a local oscillator used to provide the electromagnetic radiation interrogating the resonance frequency.

11. The method of claim 10, further comprising providing a controller including a field programmable gate array (FPGA), wherein the FPGA controls the DC powered electronics and a frequency of the electromagnetic radiation interrogating the resonance frequency provided by the local oscillator.

12. The method of claim 1, wherein the ion trap assembly comprises a first trap connected to a second trap and the ions are transferred between the first trap and the second trap, the method further comprising:

positioning a first refractive optic for inputting ultraviolet electromagnetic radiation to electromagnetically pump the ions into a ground state of the clock transition in the first trap, and positioning a second refractive optic for collecting the fluorescence generated by the ions after excitation in the first trap by the ultraviolet electromagnetic radiation and after the interrogation of the resonance frequency in the second trap.

13. The method of claim 12, wherein the first and second refractive optics comprise first and second aspheric doublets, respectively, the method further comprising:

designing the first aspheric doublet to reduce unwanted scattering off of nearby surfaces and image the ultraviolet electromagnetic radiation, comprising diffuse mercury plasma discharge having a wavelength of 194 nm, onto an ion cloud comprising the ions in the first trap.

14. The method of claim 13, wherein the C-field coil, the compensation coil, the ion trap assembly, and the refractive optics are dimensioned such that the apparatus fits within a surface area of 36 inches long by 18 inches wide by 18 inches high.

15. The method of claim 1, further comprising the apparatus coupled to a local oscillator (LO) having a LO frequency, wherein: the resonance frequency and the LO frequency have an Allan Deviation of at most $4.5\times10^{-13}/T^{1/2}$ and T is $10^5$ seconds or less, and the ions are $^{199}Hg^+$ ions.

16. The method of claim 15, wherein the apparatus and local oscillator consume a power of less than 40 Watts.

17. An apparatus used in an atomic clock to obtain a frequency standard, comprising:

an ion trap assembly for trapping a number of ions participating in a clock transition and wherein a resonance frequency of the clock transition is interrogated in an interrogation region of the ion trap assembly using electromagnetic radiation;

a C-field coil positioned for generating a first magnetic field in the interrogation region;

a compensation coil positioned for generating a second magnetic field in the interrogation region, wherein:

a combination of the first and second magnetic fields produces an ion number-dependent second order Zeeman shift in the resonance frequency that is opposite in sign to an ion number-dependent second order Doppler shift in the resonance frequency;

the C-field coil has a radius selected using data indicating how changes in the radius affect an ion-number-dependent shift in the resonance frequency, such that a variation of the number of the ions by 36% would result in the ion-number-dependent second order Doppler shift of at most 1.1(2) mHz when the second magnetic field is off;

the resonance frequency, including an adjustment by the second order Zeeman shift, is used to obtain the frequency standard; and the combination of the first and second magnetic fields is selected taking into account decoherence due to coupling of Zeeman levels and motional side bands.

18. An apparatus used in an atomic clock to obtain a frequency standard, comprising:

an ion trap assembly trapping a number of ions participating in a clock transition when a resonance frequency of the clock transition is interrogated in an interrogation region of the ion trap assembly using electromagnetic radiation;

a C-field coil; and a compensation coil, wherein:

a combination of a first magnetic field generated by the C-field coil in the interrogation region, and a second magnetic field generated by the compensation coil in the interrogation region, produces an ion number-dependent second order Zeeman shift in the resonance frequency that is opposite in sign to an ion number-dependent second order Doppler shift in the resonance frequency;

the C-field coil has a radius such that a variation of the number of the ions by 36% would result in the ion-number-dependent second order Doppler shift of at most 1.1(2) mHz when the second magnetic field is off; and the resonance frequency, including an adjustment by the second order Zeeman shift, is used to obtain the frequency standard.

19. The apparatus of claim 18, wherein the combination of the magnetic fields is selected taking into account decoherence due to coupling of Zeeman levels and motional side bands.

* * * * *